(12) United States Patent
Lee et al.

(10) Patent No.: US 11,404,457 B2
(45) Date of Patent: **\*Aug. 2, 2022**

(54) IMAGE SENSOR

(71) Applicant: SAMSUNG ELECTRONICS CO., LTD., Suwon-si (KR)

(72) Inventors: Gwi-Deok Ryan Lee, Suwon-si (KR); Taeyon Lee, Seoul (KR)

(73) Assignee: SAMSUNG ELECTRONICS CO., LTD., Suwon-si (KR)

( \* ) Notice: Subject to any disclaimer, the term of this patent is extended or adjusted under 35 U.S.C. 154(b) by 23 days.

This patent is subject to a terminal disclaimer.

(21) Appl. No.: 17/035,908

(22) Filed: Sep. 29, 2020

(65) Prior Publication Data

US 2021/0066362 A1    Mar. 4, 2021

Related U.S. Application Data

(63) Continuation of application No. 15/692,244, filed on Aug. 31, 2017, now Pat. No. 10,861,887.

(30) Foreign Application Priority Data

Jan. 3, 2017  (KR) .......................... 10-2017-0000838

(51) Int. Cl.
    *H01L 27/146*   (2006.01)
    *H01L 27/148*   (2006.01)
    *H01L 31/062*   (2012.01)

(52) U.S. Cl.
    CPC .... *H01L 27/14609* (2013.01); *H01L 27/1463* (2013.01); *H01L 27/14603* (2013.01);
    (Continued)

(58) Field of Classification Search
    CPC ......... H01L 27/14609; H01L 27/14614; H01L 27/14643; H01L 27/14689; H01L 27/14893
    See application file for complete search history.

(56) References Cited

U.S. PATENT DOCUMENTS 7,364,960 B2   4/2008   Lyu
7,535,037 B2   5/2009   Lyu
(Continued)

FOREIGN PATENT DOCUMENTS

JP   5365144   12/2013
JP   6074884   2/2017
(Continued)

*Primary Examiner* — Bilkis Jahan
*Assistant Examiner* — Victor V Barzykin
(74) *Attorney, Agent, or Firm* — F. Chau & Associates, LLC

(57) ABSTRACT

An image sensor may include a substrate including a plurality of unit pixel regions and having first and second surfaces facing each other. Each of the unit pixel regions may include a plurality of floating diffusion parts spaced apart from each other in the substrate, storage nodes provided in the substrate to be spaced apart from and facing the floating diffusion parts, a transfer gate adjacent to a region between the floating diffusion parts and the storage nodes, and photoelectric conversion parts sequentially stacked on one of the first and second surfaces. Each of the photoelectric conversion parts may include common and pixel electrodes respectively provided on top and bottom surfaces thereof and each pixel electrode may be electrically connected to a corresponding one of the storage nodes.

20 Claims, 34 Drawing Sheets

(52) U.S. Cl.
CPC .. *H01L 27/14636* (2013.01); *H01L 27/14643* (2013.01); *H01L 27/14689* (2013.01); *H01L 27/14893* (2013.01); *H01L 31/062* (2013.01)

(56) References Cited

U.S. PATENT DOCUMENTS

| | | |
|---|---|---|
| 7,749,831 B2 | 7/2010 | Lyu |
| 8,039,916 B2 | 10/2011 | Merrill et al. |
| 8,637,910 B2 | 1/2014 | Koo et al. |
| 8,716,769 B2 | 5/2014 | Ihara et al. |
| 8,946,845 B1 | 2/2015 | Hynecek et al. |
| 9,165,973 B2 | 10/2015 | Nakamura |
| 10,103,190 B2 * | 10/2018 | Korobov ............ H01L 27/14641 |
| 10,861,887 B2 * | 12/2020 | Lee .................... H01L 27/14636 |
| 2006/0110840 A1 * | 5/2006 | Araki ................ H01L 27/14692 438/22 |
| 2011/0108897 A1 * | 5/2011 | Koo .................. H01L 27/14609 257/292 |
| 2012/0056192 A1 * | 3/2012 | Nam .................. H01L 31/0322 257/76 |
| 2016/0172394 A1 * | 6/2016 | Lee .................. H01L 27/14621 257/432 |
| 2016/0211306 A1 * | 7/2016 | Choi ................ H01L 27/14638 |
| 2018/0190697 A1 | 7/2018 | Lee et al. |

FOREIGN PATENT DOCUMENTS

| | | |
|---|---|---|
| KR | 1020110050351 | 5/2011 |
| KR | 1020130081953 | 7/2013 |

\* cited by examiner

IMAGE SENSOR

CROSS-REFERENCE TG RELATED APPLICATIONS

This U.S. patent application is a continuation of U.S. patent application Ser. No. 15/692,244 filed on Aug. 31, 2017, which claims priority under U.S.C. § 119 to Korean Patent Application No. 10-2017-0000838, filed on Jan. 3, 2017 in the Korean Intellectual Property Office, the disclosures of which are incorporated by reference herein in their entireties.

TECHNICAL FIELD

The present inventive concept relates to an image sensor, and in particular, to an image sensor that includes a photoelectric conversion part with a multiple-layered structure.

An image sensor is a semiconductor device that converts optical images into electrical signals. In other words, an image sensor detects and conveys the information that constitutes an image. The image sensor may be classified into two types: a charge coupled device (CCD) type and a complementary metal-oxide-semiconductor (CMOS) type. The CMOS-type image sensor may be referred to as "CIS". The CIS may include a plurality of pixels, which are two-dimensionally arranged, and each of the pixels includes a photodiode (PD) that coverts incident light into an electrical signal.

SUMMARY

According to an exemplary embodiment of the inventive concept, an image sensor may include a substrate comprising a plurality of unit pixel regions, the substrate having first and second surfaces facing each other, wherein each of the unit pixel regions comprises: a plurality of floating diffusion parts spaced apart from each other in the substrate; a plurality of storage nodes provided in the substrate and spaced apart from the floating diffusion parts, wherein each of the storage nodes faces a corresponding one of the floating diffusion parts; a transfer gate adjacent to a region between the floating diffusion parts and the storage nodes; and a plurality of photoelectric conversion parts sequentially stacked on one of the first and second surfaces, wherein each of the photoelectric conversion parts comprises a common electrode and a pixel electrode, the common electrode being provided at a top surface of its photoelectric conversion part, the pixel electrode being provided at a bottom surface of its photoelectric conversion part, and electrically connected to a corresponding one of the storage nodes.

According to an exemplary embodiment of the inventive concept, an image sensor may include: a substrate including a plurality of unit pixel regions, wherein each of the unit pixel regions comprises: a plurality of floating diffusion parts, which are arranged in a line and spaced apart from each other in the substrate; a plurality of storage nodes provided in the substrate and spaced apart from the floating diffusion parts, wherein the storage nodes face the floating diffusion parts respectively; a transfer gate adjacent to a region between the floating diffusion parts and the storage nodes; a plurality of photoelectric conversion parts sequentially stacked on a tap or bottom surface of the substrate, wherein the photoelectric conversion parts absorb lights with different wavelengths and generate electric charges from the absorbed lights, and the electric chortles are transferred from the photoelectric conversion parts to their corresponding storage nodes.

According to an exemplary embodiment of the inventive concept, an image sensor may include: first, second and third layers disposed at a first side of a substrate, the first layer configured to detect a light having a wavelength corresponding to a first color, the second layer configured to detect a light having a wavelength corresponding to a second color, and the third layer configured to detect a light having a wavelength corresponding to a third color; a first storage node connected to the first layer; a second storage node connected to the second layer; a third storage node connected to the third layer; first, second and third floating diffusion parts disposed at a second side of the substrate, the first floating diffusion part facing the first storage node, the second floating diffusion part facing the second storage node, and the third floating diffusion part facing the third storage node; and a transfer gate disposed adjacent to the first floating diffusion part.

DETAILED DESCRIPTION OF THE EMBODIMENTS

Figure 1:
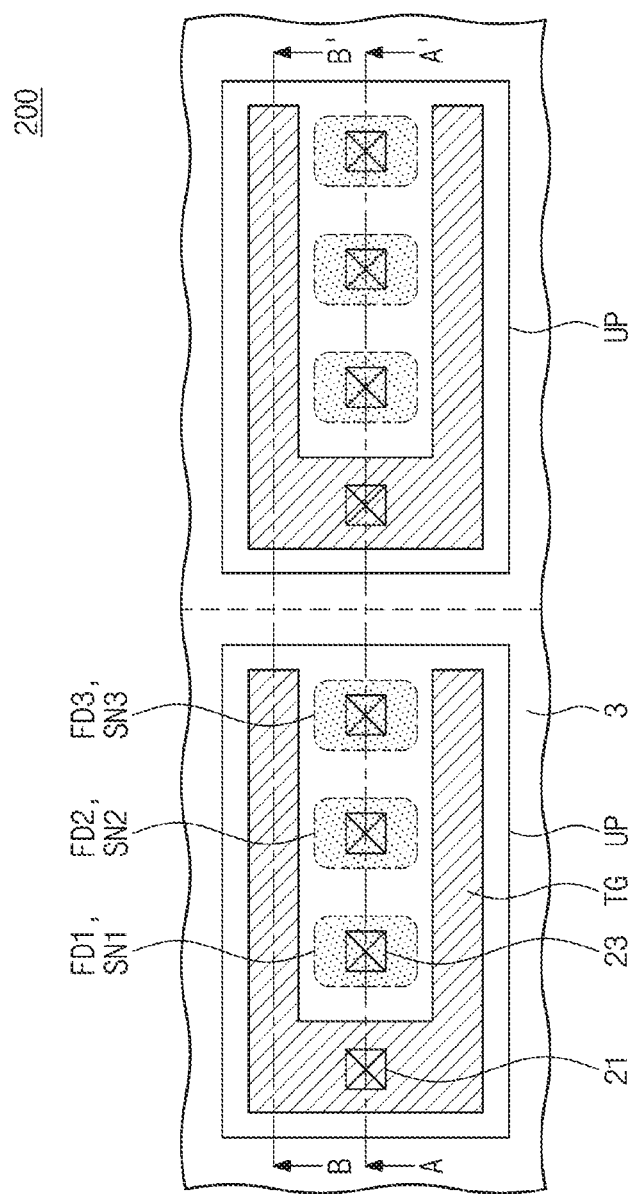
FIG. 1 is a plan view of an image sensor according to an exemplary embodiment of the inventive concept.

Exemplary embodiments of the inventive concept will now be described more fully with reference to the accompanying drawings. In the drawings, like reference numerals refer to like elements.

Figure 2:
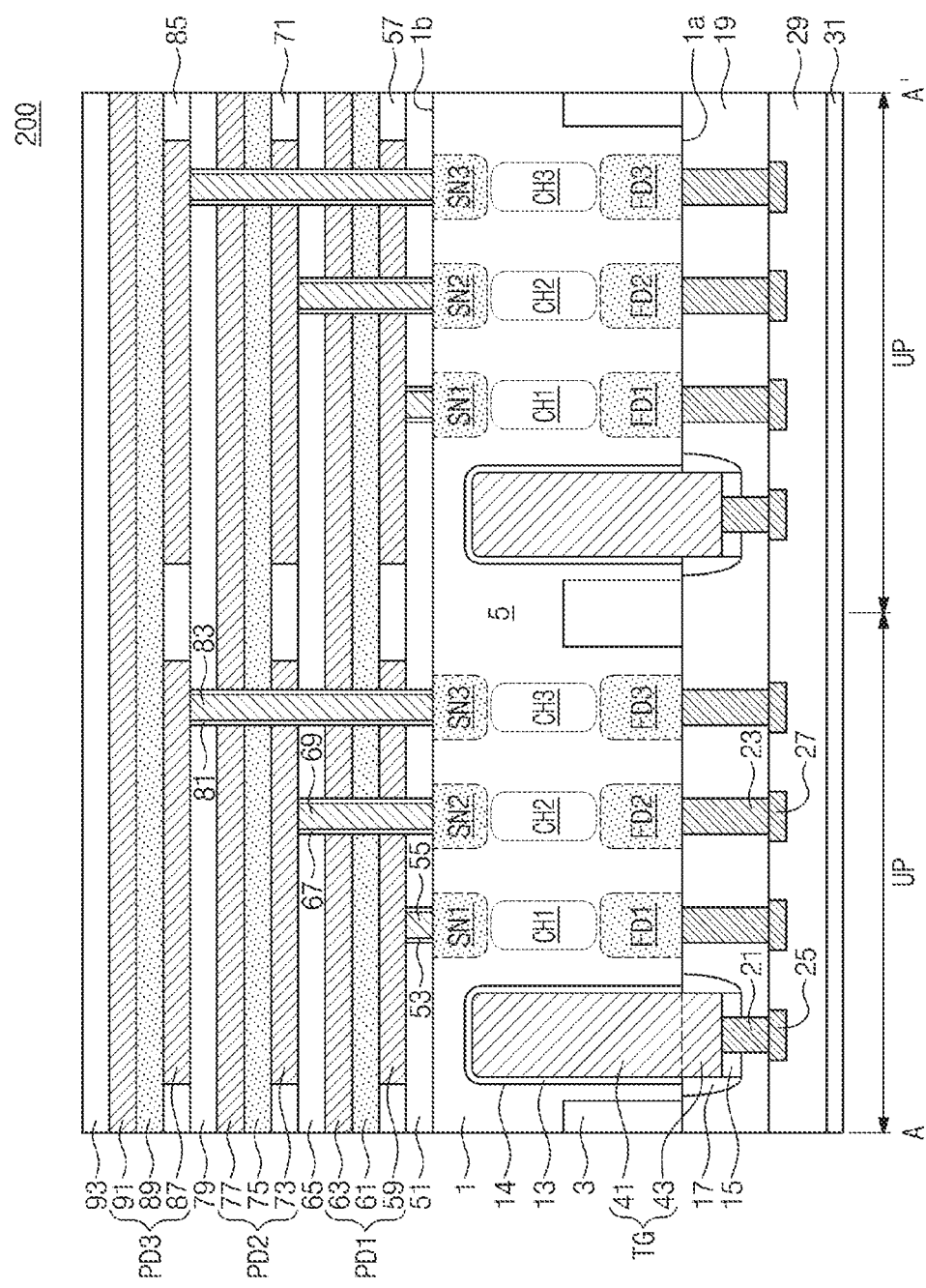
FIG. 2 is a sectional view taken along line A-A' of FIG. 1.
Figure 3:
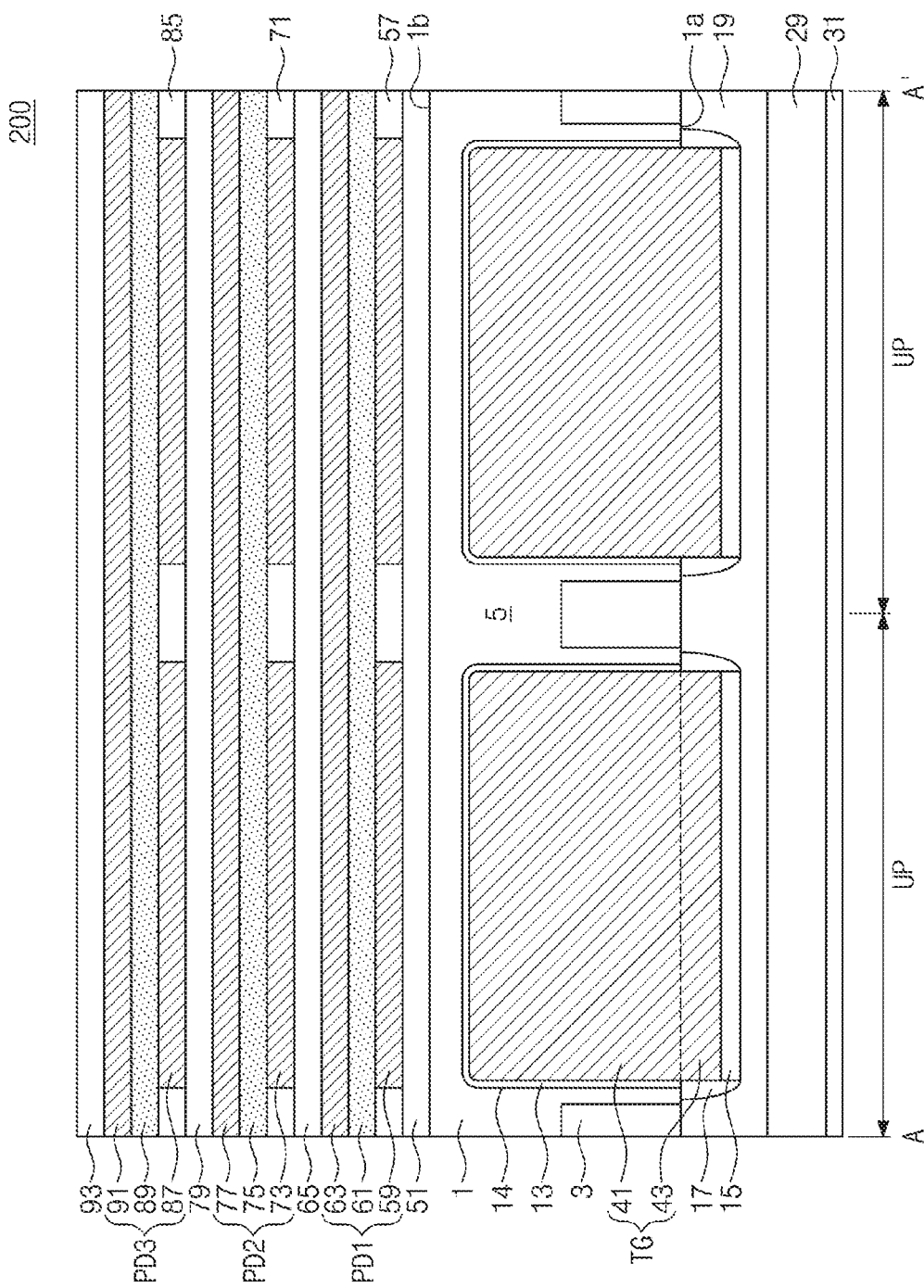
FIG. 3 is a sectional view taken along line B-B' of FIG. 1.
Figure 4:
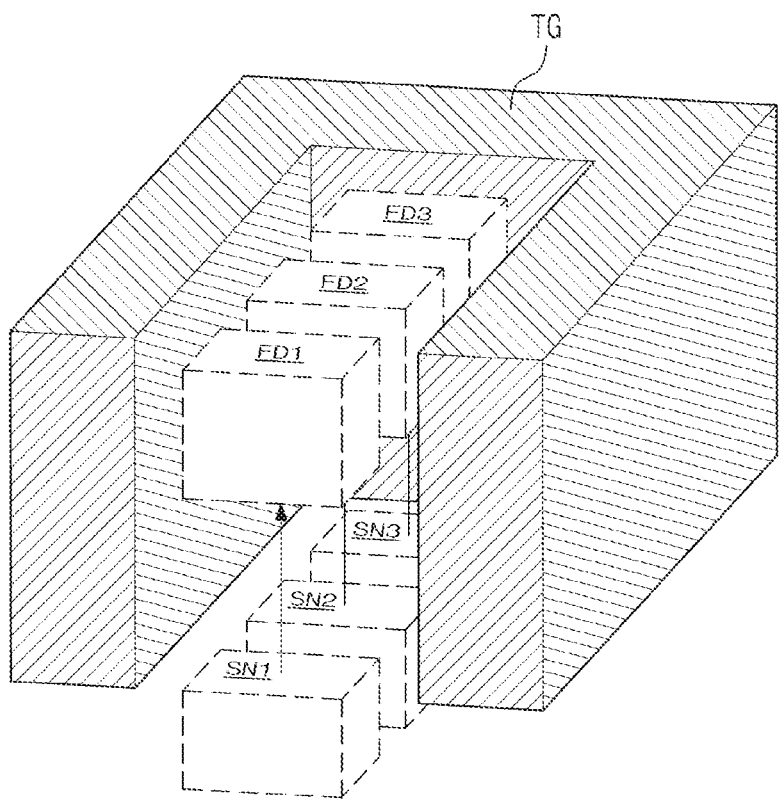
FIG. 4 is a perspective view illustrating a portion of an image sensor according to an exemplary embodiment of the inventive concept.

FIG. 1 is a plan view of an image sensor according to an exemplary embodiment of the inventive concept. FIG. 2 is a sectional view taken along line A-A' of FIG. 1. FIG. 3 is a sectional view taken along line B-B' of FIG. 1. FIG. 4 is a perspective view illustrating a portion of an image sensor according to an exemplary embodiment of the inventive concept.

Referring to FIGS. 1 to 4, an image sensor 200 may include a semiconductor substrate 1 provided with a plurality of unit pixel regions UP. The semiconductor substrate 1 may be, for example, a single-crystalline silicon wafer. The semiconductor substrate 1 may include a well region 5, which is doped to have a first conductivity type. The semiconductor substrate 1 may have first and second surfaces 1a and 1b facing each other. A device isolation layer 3 may be provided in the semiconductor substrate 1 to separate the unit pixel regions UP from each other. The device isolation layer 3 may have a shallow trench isolation (STI) or deep trench isolation (DTI) structure. In the case where the device isolation layer 3 has the DTI structure, the device isolation layer 3 may penetrate the semiconductor substrate 1 from the first surface 1a to the second surface 1b. Although the device isolation layer 3 is illustrated to be spaced apart from the second surface 1b, the device isolation layer 3 may be extended to the second surface 1b. For example, the device isolation layer 3 may contact the second surface 1b or be adjacent to the second surface 1b.

In each of the unit pixel regions UP, floating diffusion parts FD1, FD2, and FD3 may be provided in a portion of the substrate 1 adjacent to the first surface 1a. The floating diffusion parts FD1, FD2, and FD3 may be arranged in a line and may be spaced apart from each other. In each of the unit pixel regions UP, storage nodes SN1, SN2, and SN3 may be provided in another portion of the substrate 1 adjacent to the second surface 1b. The storage nodes SN1, SN2, and SN3 may be arranged in a line and may be spaced apart from each other. The storage nodes SN1, SN2, and SN3 may be overlapped with the floating diffusion parts FD1, FD2, and FD3, respectively, when viewed in a plan view. Each of the storage nodes SN1, SN2, and SN3 may be spaced apart from the floating diffusion parts FD1, FD2, and FD3. The storage nodes SN1, SN2, and SN3 and the floating diffusion parts FD1, FD2, and FD3 may be impurity regions that are doped to have a second conductivity type different from the first conductivity type.

A transfer gate TG may be provided near the storage nodes SN1, SN2, and SN3 and the floating diffusion parts FD1, FD2, and FD3. The transfer gate TG may include a protruded gate portion 43, which is provided on the first surface 1a, and a buried gate portion 41, which is extended from the protruded gate portion 43 and is inserted into the semiconductor substrate 1. When viewed in a plan view, the transfer gate. TG may be shaped like a letter 'C'. For example, in reference to FIGS. 1 and 4, the transfer gate TG may be placed at both sides of each of channel regions CH1-CH3, which will be formed by a voltage during a subsequent operation. By configuring the transfer gate TG to have the C shape, the channel regions CH1-CH3 can be easily formed, and consequently, a charge-transfer efficiency and an operation speed of the transfer gate TG may be increased. A gate insulating layer 13 may be interposed between the transfer gate TG and the semiconductor substrate 1. The semiconductor substrate 1 may have a recessed region 14, and the buried gate portion 41 may be provided in the recessed region 14.

A capping pattern 15 and a spacer 17 may be provided to cover a top surface and a side surface, respectively, of the protruded gate portion 43. The first surface 1a may be covered with a first interlayered insulating layer 19. A gate contact plug 21 may penetrate the first interlayered insulating layer 19 and the capping pattern 15 and may be electrically connected to the transfer gate TG. FD contact plugs 23 may penetrate the first interlayered insulating layer 19 and may be electrically connected to the first to third floating diffusion parts FD1-FD3, respectively. The gate contact plug 21 and the FD contact plugs 23 may be formed of or include at least one of doped polysilicon, titanium, titanium nitride, tantalum, tantalum nitride, or tungsten.

A transfer gate line 25 and FD lines 27 may be provided on the first interlayered insulating layer 19. The transfer gate line 25 may be electrically connected to the gate contact plug 21. The FD lines 27 may be electrically connected to the FD contact plugs 23, respectively. A second interlayered insulating layer 29 and a passivation layer 31 may be sequentially stacked on the first interlayered insulating layer 19. The first and second interlayered insulating layers 19 and 29 may be formed of silicon oxide based materials. The passivation layer 31 may be formed of silicon nitride or polyimide.

Photoelectric conversion parts PD1, PD2, and PD3 may be sequentially stacked on the second surface 1b. The photoelectric conversion parts PD1, PD2, and PD3 may include a first photoelectric conversion part PD1, a second photoelectric conversion part PD2, and a third photoelectric conversion part PD3, which are sequentially stacked on the second surface 1b. The first photoelectric conversion part PD1 may include a first pixel electrode 59, a first photoelectric conversion layer 61, and a first common electrode 63. A plurality of the first common electrodes 63 are positioned at a same level over the substrate 1 in the plurality of unit pixel regions UP. The first common electrodes 63 may be separated into each of the unit pixel regions by a first pattern 57 interposed between the first common electrodes 63. The first insulating pattern 57 may be formed of an insulating material (e.g., silicon oxide, silicon nitride, or silicon oxynitride). The first photoelectric conversion layer 61 and the first common electrode 63 may cover substantially all of the second surface 1b. A third interlayered insulating layer 51 may be interposed between the first photoelectric conversion part PD1 and the second surface 1b. A first SN contact plug 55 may penetrate the third interlayered insulating layer 51 and electrically connect the first pixel electrode 59 to the first storage node SN1. A first insulating layer 53 may surround the first SN contact plug 55 or cover a side surface of the first SN contact plug 55.

A fourth interlayered insulating layer 65 may be interposed between the first photoelectric conversion part PD1 and the second photoelectric conversion part PD2. The second photoelectric conversion part PD2 may include a second pixel electrode 73, a second photoelectric conversion layer 75, and a second common electrode 77. In an exemplary embodiment of the inventive concept, a plurality of the second pixel electrodes 73, which are spaced apart from each other by a second insulating pattern 71 interposed therebetween, may be provided in each layer, and each of the second pixel electrodes 73 may be placed on a corresponding one of the unit pixel regions UP. The second insulating pattern 71 may be formed of an insulating material (e.g., silicon oxide, silicon nitride, or silicon oxynitride). Me second photoelectric conversion layer 75 and the second common electrode 77 may cover substantially all of the second surface 1b. A second SN contact plug 69 may penetrate the fourth interlayered insulating layer 65, the first photoelectric conversion part PD1, and the third interlayered insulating layer 51 and electrically connect the second pixel electrode 73 to the second storage node SN2. A second insulating layer 67 may be provided on a side surface of the second SN contact plug 69 to electrically separate the second SN contact plug 69 from the first photoelectric conversion part PD1.

A fifth interlay red insulating layer 79 may be interposed between the second photoelectric conversion part PD2 and the third photoelectric conversion part PD3. The third photoelectric conversion part PD3 may include a third pixel electrode 87, a third photoelectric conversion layer 89, and a third common electrode 91. In an exemplary embodiment of the inventive concept, a plurality of the third pixel electrodes 87, which are spaced apart from each other by a third insulating pattern 85 interposed therebetween, may be provided in each layer, and each of the third pixel electrodes 87 may be placed on a corresponding one of the unit pixel regions UP. The third insulating pattern 85 may be formed of an insulating material (e.g., silicon oxide, silicon nitride, or silicon oxynitride). The third photoelectric conversion layer 89 and the third common electrode 91 may cover substantially all of the second surface 1b. A third SN contact plug 83 may penetrate the fifth interlayered insulating layer 79, the second photoelectric conversion part PD2, the fourth interlayered insulating layer 65, the first photoelectric conversion part PD1, and the third interlayered insulating layer 51 and may be used to electrically connect the third pixel electrode 87 to the third storage node SN3. A third insulating layer 81 may be provided on a side surface of the third SN contact plug 83 to electrically separate the third SN contact plug 83 from the second photoelectric conversion part PD2 and the first photoelectric conversion part PD1. A protection layer 93 may be placed on the third photoelectric conversion part PD3. The first to fifth interlayered insulating layers 19, 29, 51, 65, 79, and 93 and the first to third insulating patterns 57, 71, and 85 may be formed of the same insulating material (e.g., silicon oxide). The first to third insulating layers 53, 67, and 81 may be formed of at least one of, for example, silicon oxide, silicon nitride, or silicon oxynitride. The protection layer 93 may be formed of, for example, silicon nitride or polyimide.

The protection layer 93, the fourth and fifth interlayered insulating layers 65 and 79, and the first to third insulating patterns 57, 71, and 85 may be formed of a transparent insulating material. The first to third common electrodes 63, 77, and 91 may be formed of a transparent conductive material. For example, the first to third common electrodes 63, 77, and 91 may be formed of tin oxide ($SnO_2$), titanium oxide ($TiO_2$), indium oxide ($InO_2$), indium tin oxide (ITO), indium zinc oxide (IZO), or $InGaO_3(ZnO)_5$ (IGZO).

The first to third SN contact plugs 53, 69, and 83 may each have an optical transmittance different from that of the ED contact plugs 23. For example, the optical transmittance of the first to third SN contact plugs 53, 69, and 83 may be higher than that of the ED contact plugs 23. In other words, the first to third SN contact plugs 53, 69, and 83 may be more transparent than the FD contact plugs 23. Since the FD contact plugs 23 are not positioned at a light incident region, the FD contact plugs 23 may have a greater charge transfer speed. Thus, the FD contact plugs 23 may be formed of an opaque conductive material (e.g., tungsten). In addition, the first to third SN contact plugs 53, 69, and 83 may be positioned at the light incident region, and thus, the first to third SN contact plugs 53, 69, and 83 may be formed of a transparent conductive material. This way, light can propagate toward a region neighboring the light incident region. For example, the first to third SN contact plugs 53, 69, and 83 may be formed of tin oxide ($SnO_2$), titanium oxide ($TiO_2$), indium oxide ($InO_2$) indium tin oxide (ITO), indium zinc oxide (IZO), or $InGaO_3(ZnO)_5$ (IGZO).

The first to third photoelectric conversion layers 61, 75, and 89 may be configured to detect lights with different wavelength, respectively. For example, one of the first to third photoelectric conversion layers 61, 75, and 89 may absorb red light (e.g., a wavelength of about 620-700 nm) and generate electric, charges therefrom Another of the first to third photoelectric conversion layers 61, 75, and 89 may absorb green light (e.g., a wavelength of about 520-580 nm) and generate electric charges therefrom. The other of the first to third photoelectric conversion layers 61, 75, and 89 may absorb blue light (e.g., a wavelength of about 420-480 nm) and generate electric charges therefrom.

The first to third photoelectric conversion layers 61, 75, and 89 may include organic materials with different optical band gaps. The first to third photoelectric conversion layers 61, 75, and 89 may include one or more polymers, oligomers, and complex polymers, alone or in combination with each other. Each of the first to third photoelectric conversion layers 61, 75, and 89 may be a blend of two or more conjugated polymers or two or more organic molecules that have similar or different electron affinities and different electronic energy gaps. For example, the first to third photoelectric conversion layers 61, 75, and 89 may be formed of or include at least one of polyacetylene (PA), polyisothianaphene, polythiophene (PT), polypyrrole (PPr), poly(2,5-thienylenevinylene) (PTV)), poly(p-phenylene) (PPP), polyfluorene (PF), poly(phenylenevinylene) (PPV), polycarbazole, poly(1,6-heptadine), polyisothianaphene, polyquinolene and semiconductive polyaniline or a derivative thereof. In an exemplary embodiment of the inventive concept, the first to third photoelectric conversion layers 61, 75, and 89 may differ in terms of their molecular structure of repeating units of polymer or oligomer contained therein.

In an exemplary embodiment of the inventive concept, different molecular groups may be attached to side chains of the first to third photoelectric conversion layers 61, 75, and 89, respectively. This, may make it possible to realize a difference in band gap between the first to third photoelectric conversion layers 61, 75, and 89.

In an exemplary embodiment of the inventive concept, the first to third photoelectric conversion layers 61, 75, and 89 may include donor/acceptor polymer compounds (or n-type/p-type organic semiconductors). At least one of PPV, PT, PTV, poly(phenylene), or soluble derivatives thereof may be used as the donor polymer of the donor/acceptor polymer compounds. At least one of poly(cyano-polyphenylene vinylene) (CN-PPV), fullerene, and derivatives thereof may be used as the acceptor polymer of the donor/acceptor polymer compounds.

In an exemplary embodiment of the inventive concept, the first to third photoelectric conversion layers 61, 75, and 89 may include quantum dots (or ultrafine particles) with different optical band gaps. For example, the first to third photoelectric conversion layers 61, 75, and 89 may include cadmium selenide (CdSe) quantum dots that are coated with zinc sulfide (ZnS). In this case, there may be a difference in diameter between quantum dots contained in the first to third photoelectric conversion layers 61, 75, and 89. This difference may allow the first to third photoelectric conversion layers 61, 75, and 89 to have different optical band gaps. For example, the larger to diameter of the quantum dots, the longer a wavelength of light to be absorbed, thereby. In addition, the smaller a diameter of the quantum dots, the shorter a wavelength of light to be absorbed thereby.

In the image sensor 200, each of the first to third photoelectric conversion layers 61, 75, and 89 may absorb light of specific wavelength range, and thus, an additional color filter not required. Furthermore, the first to third photoelectric conversion layers 61, 75, and 89 may be placed outside the substrate 1, and thus, light may be easily incident into the first to third photoelectric conversion layers 61, 75, and 89. Accordingly, it is possible to omit a micro lens.

Figure 5:
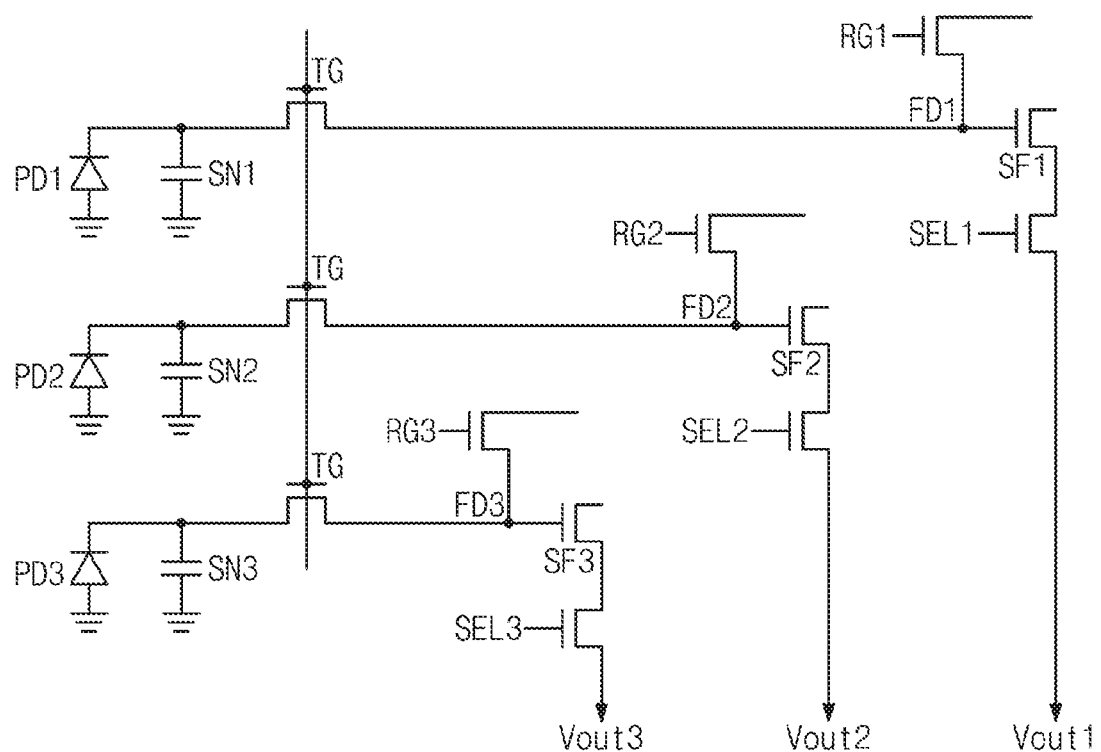
FIG. 5 is a circuit diagram of an image sensor according to an exemplary embodiment of the inventive concept.

FIG. 5 is a circuit diagram of an image sensor according to an exemplary embodiment of the inventive concept.

According to an exemplary embodiment of the inventive concept, a plural it of photoelectric conversion parts PD1, PD2, and PD3 may be provided in each unit pixel region UP of an image sensor, shown in FIG. 5. Each of the photoelectric conversion parts PD1, PD2 and PD3, may be connected to a node of a transfer transistor with a single transfer gate TG. Storage nodes SN1, SN2, and SN3 may be interposed between the photoelectric conversion parts PD1, PD2, and PD3 and the transfer transistor. A plurality of floating diffusion regions FD1, FD2, and FD3 may be connected to another node of the transfer transistor. Each of the floating diffusion regions FD1, FD2, and FD3 may be used as a source region of a corresponding one reset transistors, which are controlled by reset gates RG1, RG2, and RG3, respectively. In addition, the floating diffusion regions FD1, FD2, and FD3 may be connected to source follower gates SF1, SF2, and SF3, respectively. Source follower transistors, which are respectively controlled by the source follower gates SF1, SF2, and SF3, may be connected to selection transistors, which are respectively controlled by selection gates SEL1, SEL2, and SEL3.

Referring to FIGS. 1 to 4, if, in a light-blocking state, a voltage for turning-on the reset transistors is applied to the reset gates RG1, RG2, and RG3, electric charges may be discharged from the floating diffusion regions FD1, FD2, and FD3. Thereafter, in the case where the reset transistors are turned off and lights with different wavelengths are incident into the photoelectric conversion layers 61, 75, and 89 of the photoelectric conversion parts PD1-PD3, the photoelectric conversion layers 61, 75, and 89 may produce electron-hole pairs in proportion to energy of light incident thereto. If a voltage is applied to the pixel electrodes 59, 73, 87 and the common electrodes 63, 77, and 91 of the photoelectric conversion parts PD1-PD3, electric charges (e.g., electrons or holes) may be transferred to the pixel electrodes 59, 73, 87 and may be accumulated in the storage nodes SN1, SN2, and SN3 thorough the SN contact plugs 55, 69, and 83. If a voltage for turning-on the transfer transistors is applied to the transfer gates TG, channel regions CH1-CH3 may be formed near the buried gate portions 41. The channel regions CH1-CH3 may be formed between the buried gate portions 41. The channel regions CH1-CH3 may be spaced apart from each other and may be arranged in a line. For example, a first channel region CH1 may be formed between the first storage node SN1 and the first floating diffusion part FD1, a second channel region CH2 may be formed between the second storage node SN2 and the second floating diffusion part FD2, and a third channel region CH3 may be formed between the third storage node SN3 and the third floating diffusion part FD3. As a result of the formation of the channel regions CH1-CH3, the electric charges may be transferred from the storage nodes SN1, SN2, and SN3 to the floating diffusion parts FD1, FD2, and FD3 in a vertical direction, as depicted by the arrows in FIG. 4. This may lead to a change in electric potential of the source follower gates SF1, SF2, and SF3 and moreover, a change in electric potential of source regions of transistors, which are controlled by the source follower gates SF1, SF2, and SF3. If, at this time, the selection transistors are turned on, electric signals generated from the incident light may be output through the selection transistors as Vout1-Vout3.

As described above, each unit pixel region UP may be configured to detect lights with different wavelengths. In addition, one transfer gate IG is provided in the unit pixel region UP, but the transfer gate TG may be configured to simultaneously transfer signals, which are generated from the lights with different wavelengths. Thus, it is possible to increase a operation speed and an integration density of the image sensor.

FIGS. 6 to 12 are sectional views illustrating a process of fabricating an image sensor with a vertical section of FIG. 2, according to an exemplary embodiment of the inventive concept.

Figure 6:
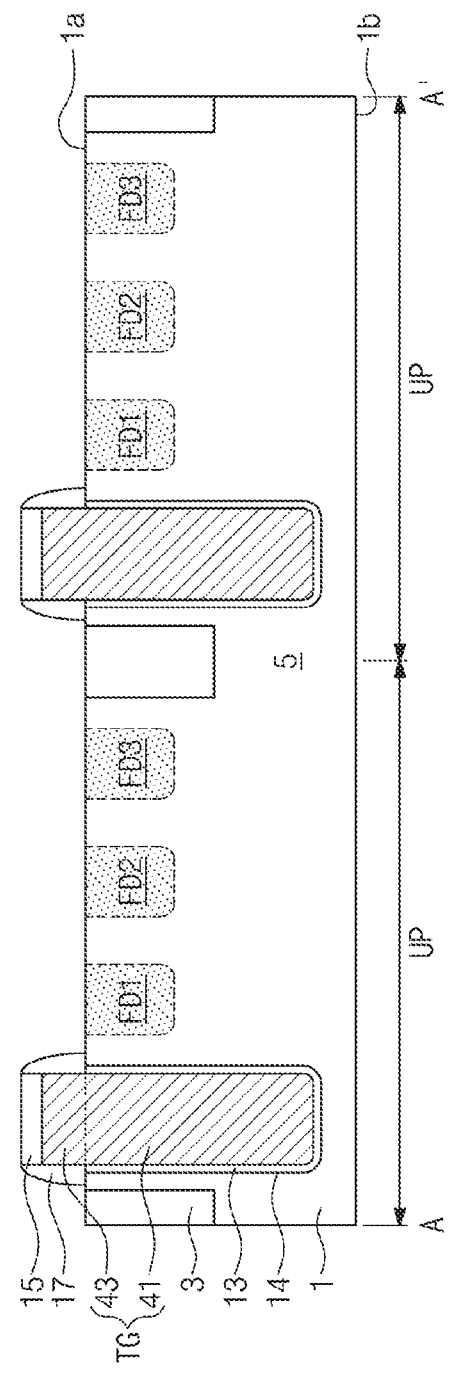
FIGS. 6, 7, 8, 9, 10, 11 and 12 are sectional views illustrating a process of fabricating an image sensor with a vertical section of FIG. 2, according to an exemplary embodiment of the inventive concept.

Referring to FIGS. 1 and 6, a substrate 1 may be prepared. The substrate 1 may include a plurality of unit pixel regions UP and may have first and second surfaces 1a and 1b facing each other. The substrate 1 may be, for example, a single-crystalline silicon wafer. An ion implantation process may be performed to form a well region 5 of a first conductivity type, in the semiconductor substrate 1. A device isolation layer 3 may be formed in the semiconductor substrate 1 to define unit pixel regions UP and active regions. The device isolation layer 3 may be formed of or include at least one of, for example, silicon oxide, silicon nitride, and silicon oxynitride. An ion implantation process may be performed to inject dopants into the semiconductor substrate 1 through the first surface 11a, and thus, floating diffusion parts FD1, FD2, and FD3 may be formed adjacent to the first surface 1a and in the semiconductor substrate 1. The floating diffusion parts FD1, FD2, and FD3 may be spaced apart from each other along a column or, e.g., a line. The semiconductor substrate 1 may be etched to form recessed regions 14 near the floating diffusion parts FD1, FD2, and FD3. A thermal oxidation process may be performed to form a gate insulating layer 13 on surfaces of the recessed region 14 and the semiconductor substrate 1. A conductive layer may be formed to fill the recessed regions 14. A capping pattern 15 may be formed on the conductive layer, and then, an etching process using the capping pattern 15 as an etch mask may be performed on the conductive layer to form a transfer gate TG. A spacer 17 may be formed to cover a side surface of the transfer gate TG. In an exemplary embodiment of the inventive concept, the formation of the transfer gate TG and the floating diffusion parts FD1, FD2, and FD3 may be performed in reverse order.

Figure 7:
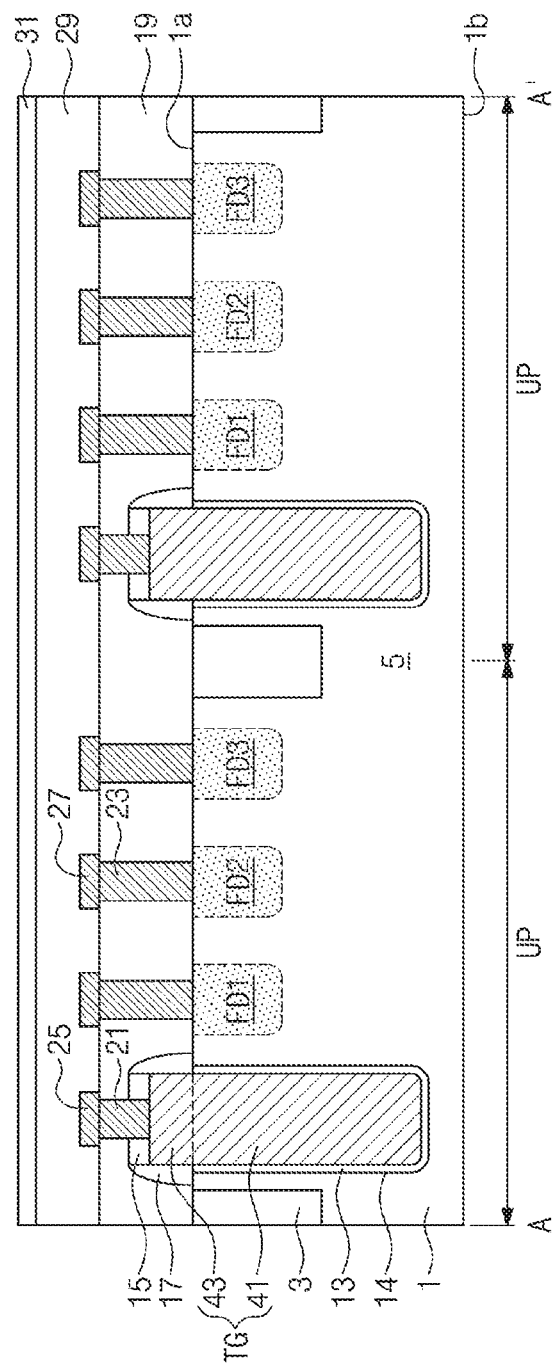

Referring to FIGS. 1 and 7, a first interlayered insulating layer 19 may be formed to cover the semiconductor substrate 1. The first interlayered insulating layer 19 may be patterned to form contact holes, and a gate contact plug 21 and FD contact plugs 23 may be formed by filling the contact holes with a conductive material. On the first interlayered insulating layer 19, a transfer gate line 25 and FD lines 27 may be formed to be in contact with the gate contact plug 21 and the FD contact plugs 23, respectively. A second interlayered insulating layer 29 and a passivation layer 31 may be sequentially formed on the first interlayered insulating layer 19.

Figure 8:
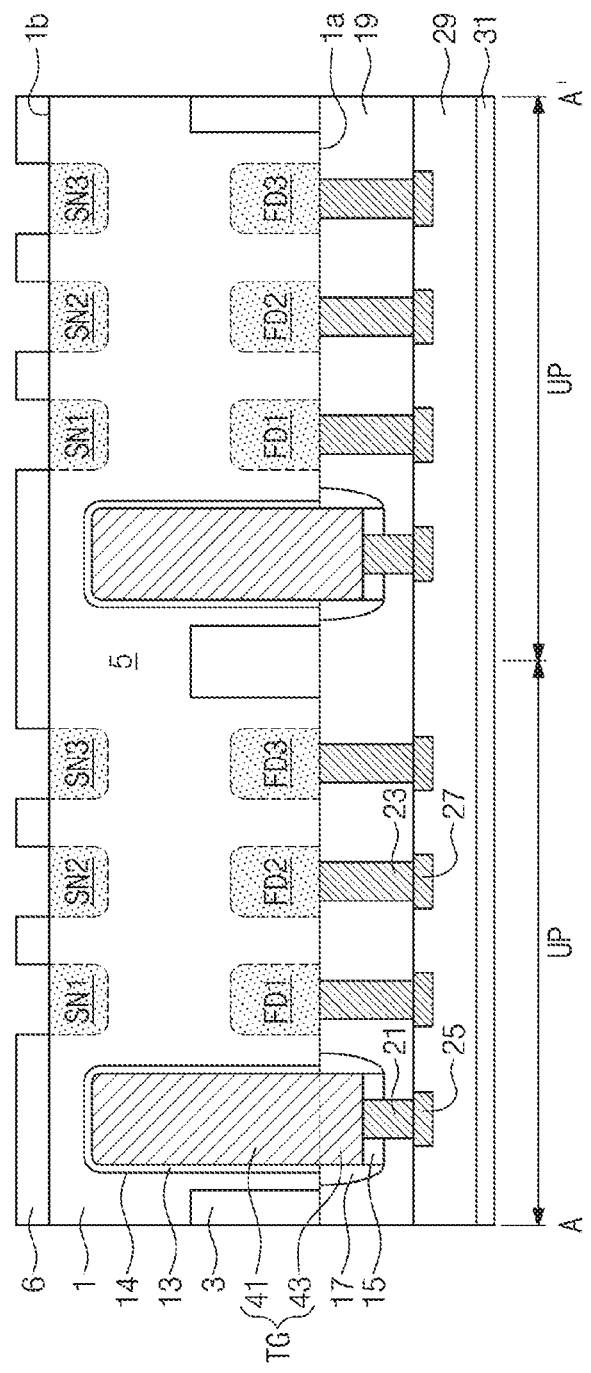

Referring to FIGS. 1 and 8, the semiconductor substrate 1 may be inverted in such a way that the second surface 1b is oriented in an upward direction. A mask pattern 6 may be formed on the second surface 1b to define positions of storage nodes SN1, SN2, and SN3. An ion implantation process using the mask pattern 6 as an ion injection mask may be performed to form storage nodes SN1, SN2, and SN3 in the semiconductor substrate 1 and adjacent to the second surface 1b.

Figure 9:
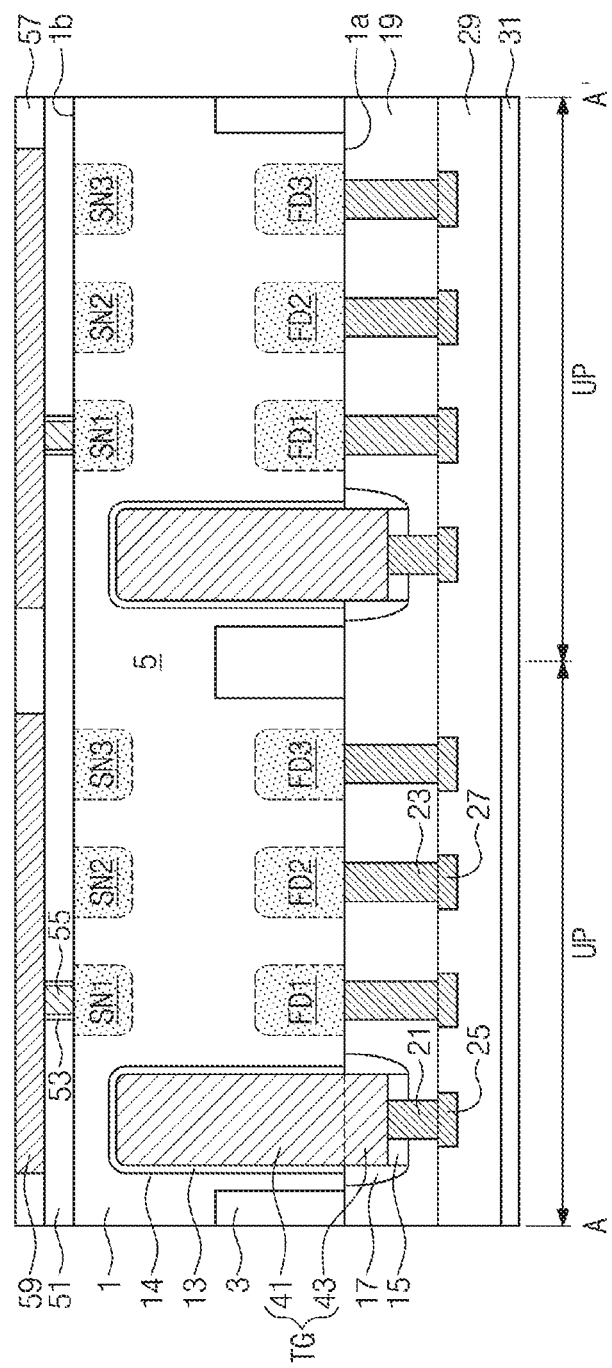

Referring to FIG. 9, the mask pattern 6 may be removed to expose the second surface 1b. A third interlayered insulating layer 51 may be formed on the second surface 1b. The third interlayered insulating layer 51 may be patterned to form a contact hole exposing the first storage node SN1. A first insulating layer 53 may be formed to cover an inner sidewall of the contact hole, and a first SN contact plug 55 may be formed by filling the contact hole with a conductive material. A transparent conductive layer may be formed on the third interlayered insulating layer 51 and may be patterned to form a first pixel electrode 59 in contact with the first SN, contact plug 55. The first pixel electrode 59 may be formed by a deposition process (e.g., a sputtering or chemical vapor deposition (CVD) process) and may be formed a tin oxide (SnO$_2$), titanium oxide (TiO$_2$), indium oxide (InO$_2$), indium tin oxide (ITO), indium zinc oxide (IZO), or InGaO$_3$(ZnO)$_5$ (IGZO). A first insulating pattern 57 may be formed on the third interlayered insulating layer 51 to be in contact with a side surface of the first pixel electrode 59.

Figure 10:
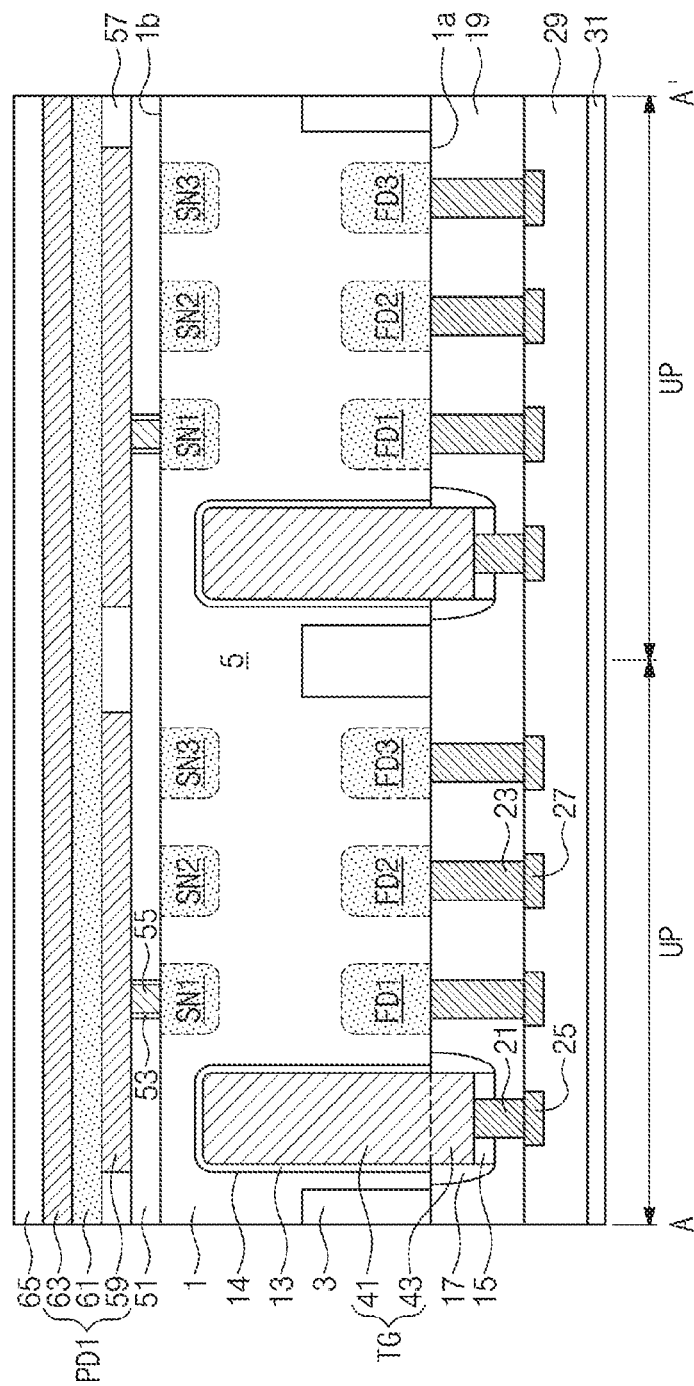

Referring to FIG. 10, a first photoelectric conversion layer 61 may be formed on the first pixel electrode 59 and the first insulating pattern 57. In a case that the first photoelectric conversion layer 61 includes an organic material, a solution containing the organic material may coat the first pixel electrode 59 and the first insulating pattern 57 by using a method such as spin coating. The solution may then be thermally dried to form the first photoelectric conversion layer 61. Alternatively, the organic material may be directly deposited on the first pixel electrode 59 and the first insulating pattern 57 by CVD to form the first photoelectric conversion layer 61. In a case that the first photoelectric conversion layer 61 includes quantum dots, the quantum dots may be dispersed in an organic solvent to make a solution. This solution may coat the first pixel electrode 59 and the first insulating pattern 57 by using a method such as spin coating and then be dried to form the first photoelectric conversion layer 61. A first common electrode 63 and a fourth interlayered insulating layer 65 may be sequentially formed on the first photoelectric conversion layer 61. The first common electrode 63 may be formed of transparent conductive material and may be formed by using a sputtering or CVD method.

Figure 11:
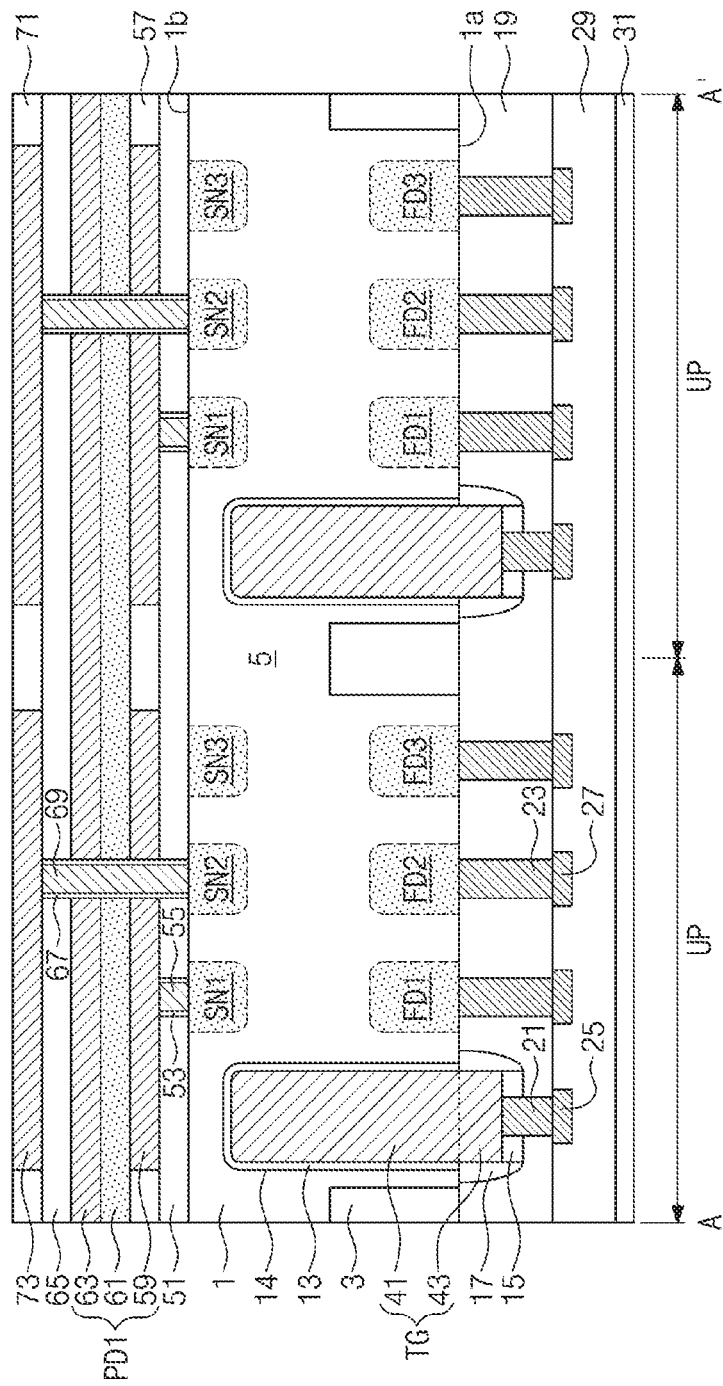

Referring to FIG. 11, the fourth interlayered insulating layer 65, the first common electrode 63, the first photoelectric conversion layer 61, the first pixel electrode 59, and the third interlayered insulating layer 51 may be sequentially patterned to form a contact hole exposing the second storage node SN2. A second insulating layer 67 may be formed to cover an inner surface of the contact hole, and then, a second SN contact plug 69 may be formed by filling the contact hole with a conductive material. A transparent conductive layer may be formed on the fourth interlayered insulating layer 65 and may be patterned to form a second pixel electrode 73 in contact with the second SN contact plug 69. A second insulating pattern 71 may be formed on the fourth interlayered insulating layer 65 to be in contact with a side surface of the second pixel electrode 73.

Figure 12:
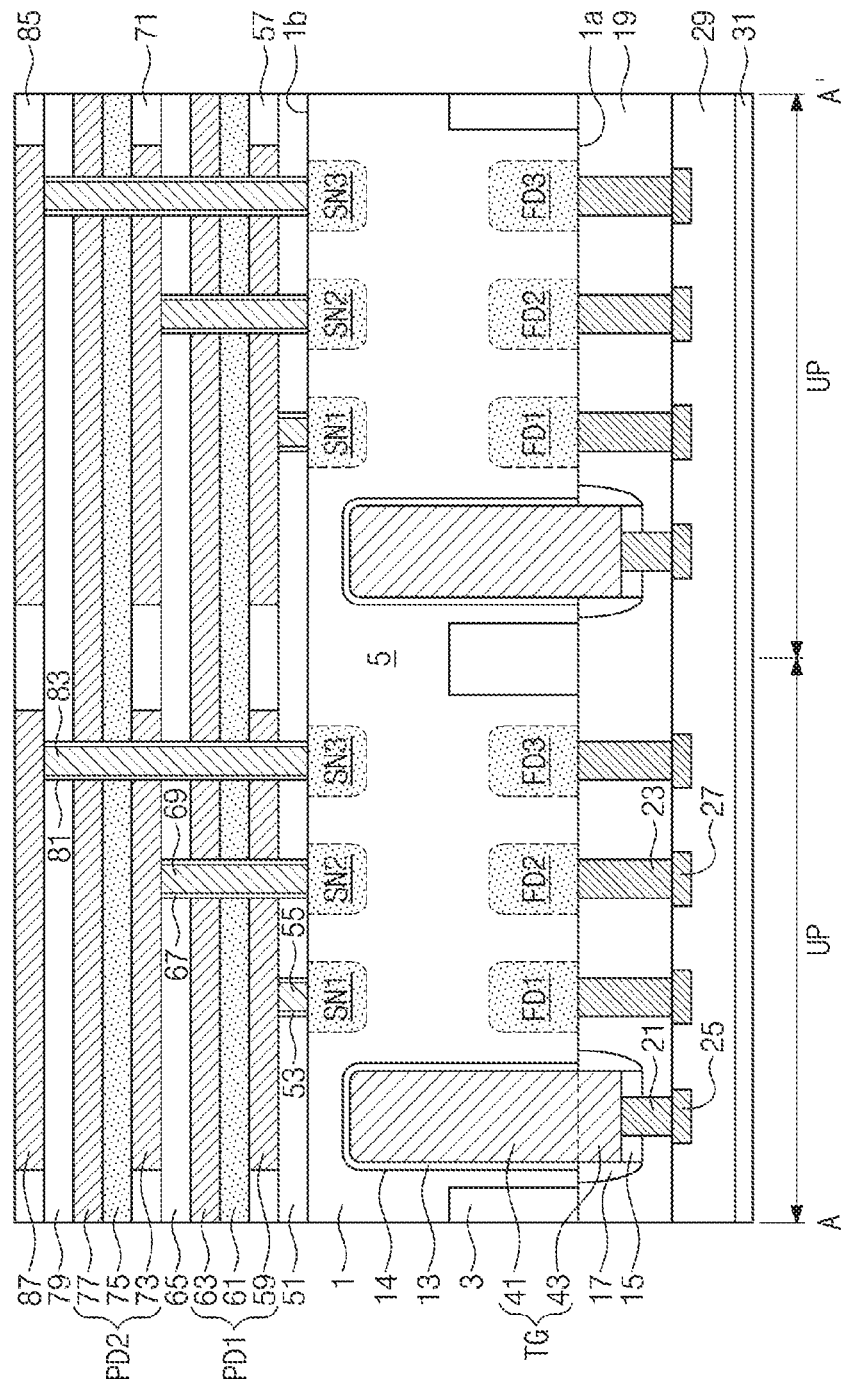

Referring to FIG. 12, a second photoelectric conversion layer 75, a second co ion electrode 77, and a fifth interlayered insulating layer 79 may be sequentially formed on the second pixel electrode 73 and the second insulating pattern 71. The methods of forming the second photoelectric conversion layer 75 and the second common electrode 77 may be the same as or similar to those for forming the first photoelectric conversion layer 61 and the first common electrode 63. The fifth interlayered insulating layer 79, the second common electrode 77, the second photoelectric conversion layer 75, the second pixel electrode 73, the fourth interlayered insulating layer 65, the first common electrode 63, the first photoelectric conversion layer 61, the first pixel electrode 59 and the third interlayered insulating layer 51 may be sequentially patterned to form a contact hole exposing the third storage node SN3. A third insulating layer 81 may be formed to cover an inner surface of the contact hole, and then, a third SN contact plug 83 may be formed by filling the contact hole with a conductive material. A transparent conductive layer may be formed on the fifth interlayered insulating layer 79 and may be patterned to form a third pixel electrode 87 in contact with the third SN contact plug 83. A third insulating pattern 85 may be formed on the fifth interlayered insulating layer 79 to be in contact with a side surface of the third pixel electrode 87.

Referring back to FIG. 2, a third photoelectric conversion layer 89, a third common electrode 91, and the protection layer 93 may be sequentially formed on the third pixel electrode 87 and the third insulating pattern 85.

Figure 13:
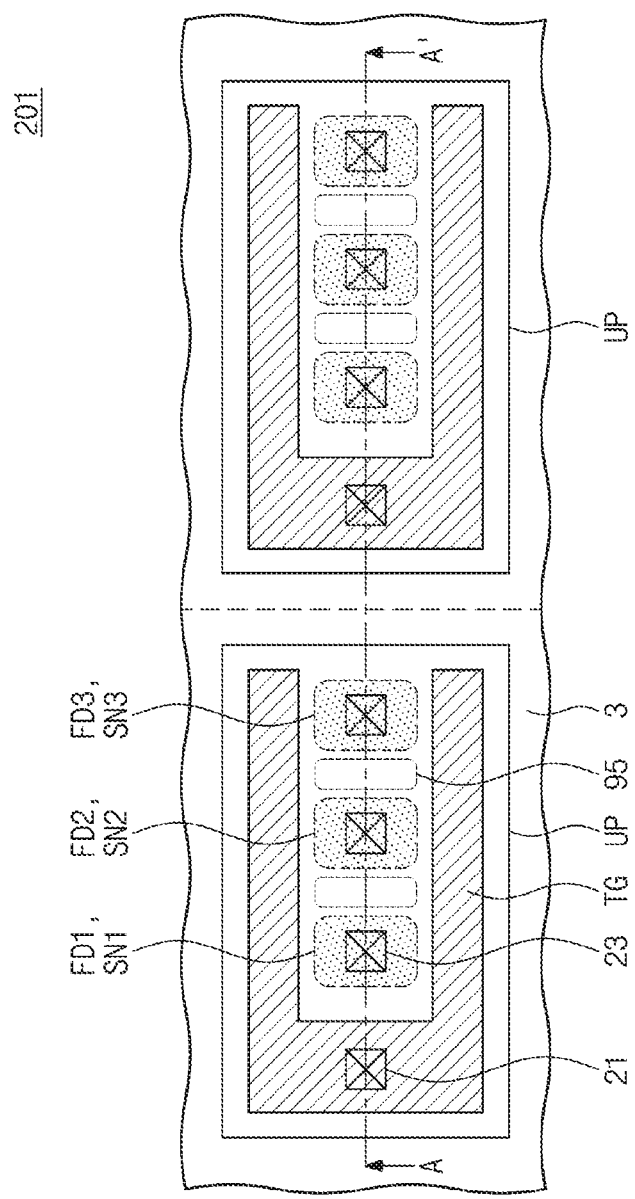
FIG. 13 is a plan view of an image sensor according to an exemplary embodiment of the inventive concept.
Figure 14:
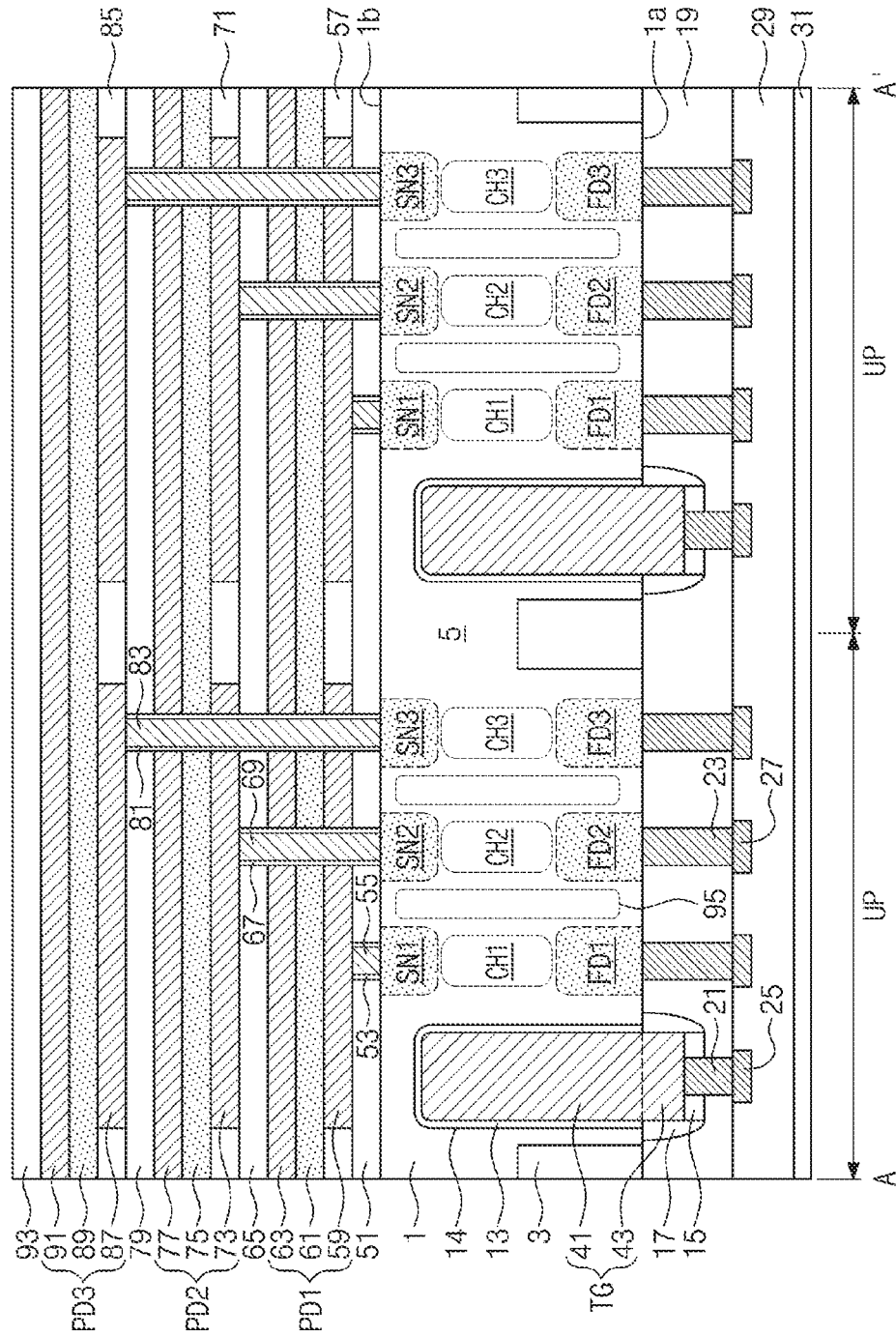
FIG. 14 is a sectional view taken along line A-A' of FIG. 13.

FIG. 13 is a plan view of an image sensor according to an exemplary embodiment of the inventive concept. FIG. 14 is a sectional view taken along line A-A' of FIG. 13.

Referring to FIGS. 13 and 14, an image sensor 201 may further include separation regions 95 interposed between the channel regions CH1, CH2, and CH3. In an exemplary embodiment of the inventive concept, each of the separation regions 95 may be interposed between an adjacent pair of the channel regions CH1, CH2, and CH3. The separation regions 95 may be separated from the first and second surfaces 1a and 1b. The separation regions 95 may be impurity regions that are formed in the semiconductor substrate 1 and are doped to have the same conductivity type (e.g., the conductivity type) as that of the well region 5. The separation regions 95 may be formed by an ion implantation process. A doping concentration of the separation regions 95 may be higher than that of the well region 5. Except for the above features, the image sensor 201 may be configured to have substantially the same features as those of the image sensor 200 described with reference to FIGS. 1 to 4. The separation regions 95 may be used to separate tale channel regions CH1, CH2, and CH3 from each other, and thus, cross-talk can be prevented from occurring between electric signals that are generated from lights with different wavelengths.

Figure 15:
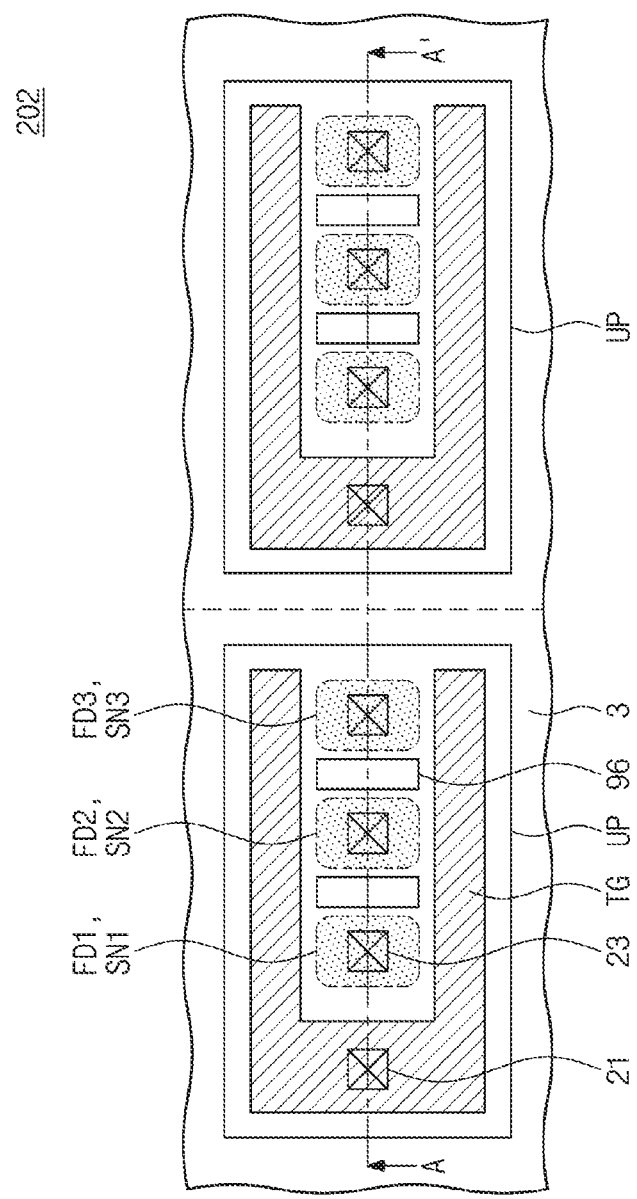
FIG. 15 is a plan view of an image sensor according to an exemplary embodiment of the inventive concept.
Figure 16:
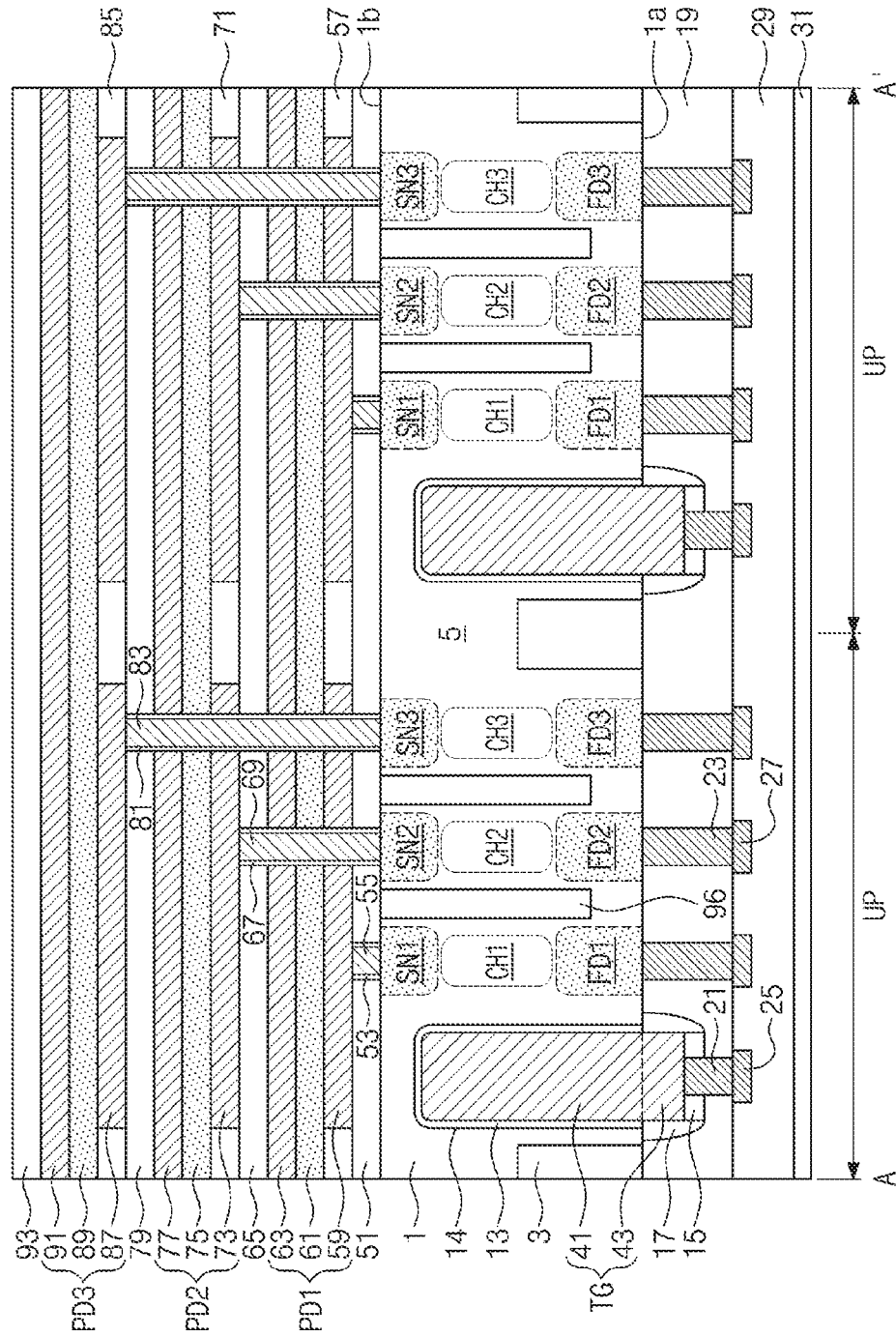
FIG. 16 is a sectional view taken along line A-A' of FIG. 15.

FIG. 15 is a plan view of an image sensor according to an exemplary embodiment of the inventive concept. FIG. 16 is a sectional view taken along line A-A' of FIG. 15.

Referring to FIGS. 15 and 16, an image sensor 202 may further include separation parts 96 interposed between the channel regions CH1, CH2, and CH3, an exemplary embodiment of the inventive concept, each of the separation parts 96 may be interposed between an adjacent pair of the channel regions CH1, CH2, and CH3. The separation parts 96 may be formed of an insulating material (e.g., silicon oxide). Each of the separation parts 96 may be a doped semiconductor pattern that is doped to have the same conductivity type as that of the well region 5 and to have a higher doping concentration than that of the well region 5. The separation parts 96 may be, for example, polysilicon patterns. The separation parts 96 may be inserted into the semiconductor substrate 1 through the second surface 1b. The separation parts 96 may be in contact with the second surface 1b. In an exemplary embodiment of the inventive concept, the separation parts 96 may be formed before or after the formation of the storage nodes SN1, SN2, and SN3 (e.g., during the step of FIG. 8), and the formation of the separation parts 96 may include etching the second surface 1b of the semiconductor substrate 1 to form a trench and filling the trench with an insulating material. In an exemplary embodiment of the inventive concept, a doped semiconductor material, which is formed in an in-situ manner, may be used to fill the trench. Except for the above differences, the image sensor 202 may be fabricated by a method that is substantially the same as or similar to that described with reference to FIGS. 1 to 4. The separation parts 96 may be used to separate the channel regions CH1, CH2, and CH3 from each other, and thus, cross-talk can be prevented from occurring between electric signals that are generated from lights with different wavelengths.

Figure 17:
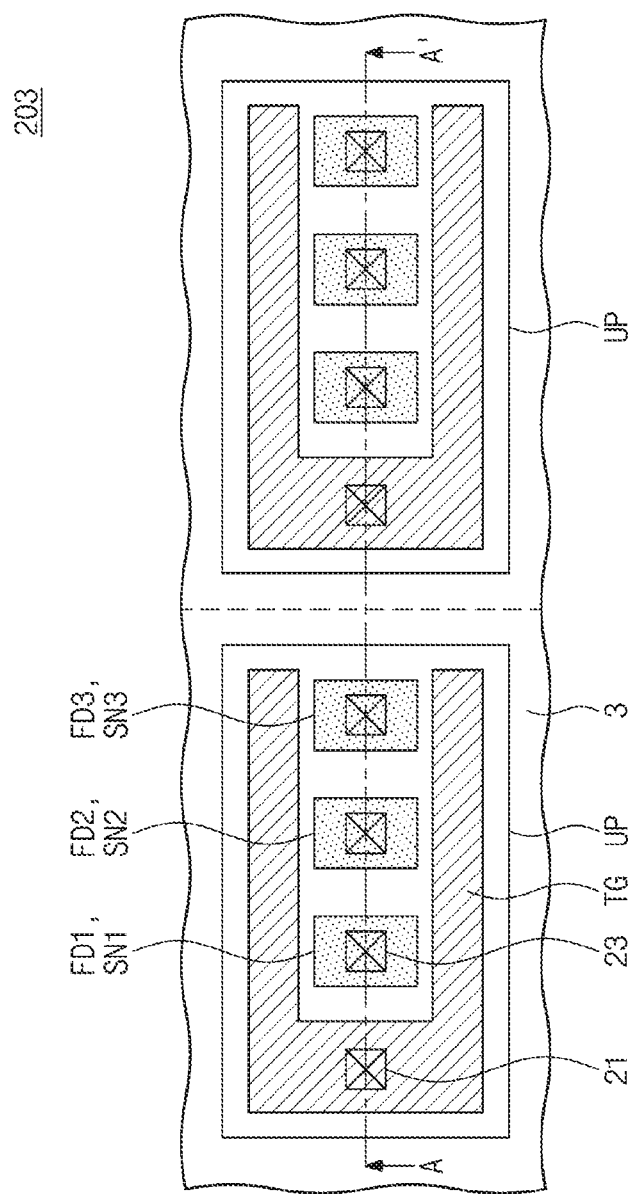
FIG. 17 is a plan view of an image sensor according to an exemplary embodiment of the inventive concept.
Figure 18:
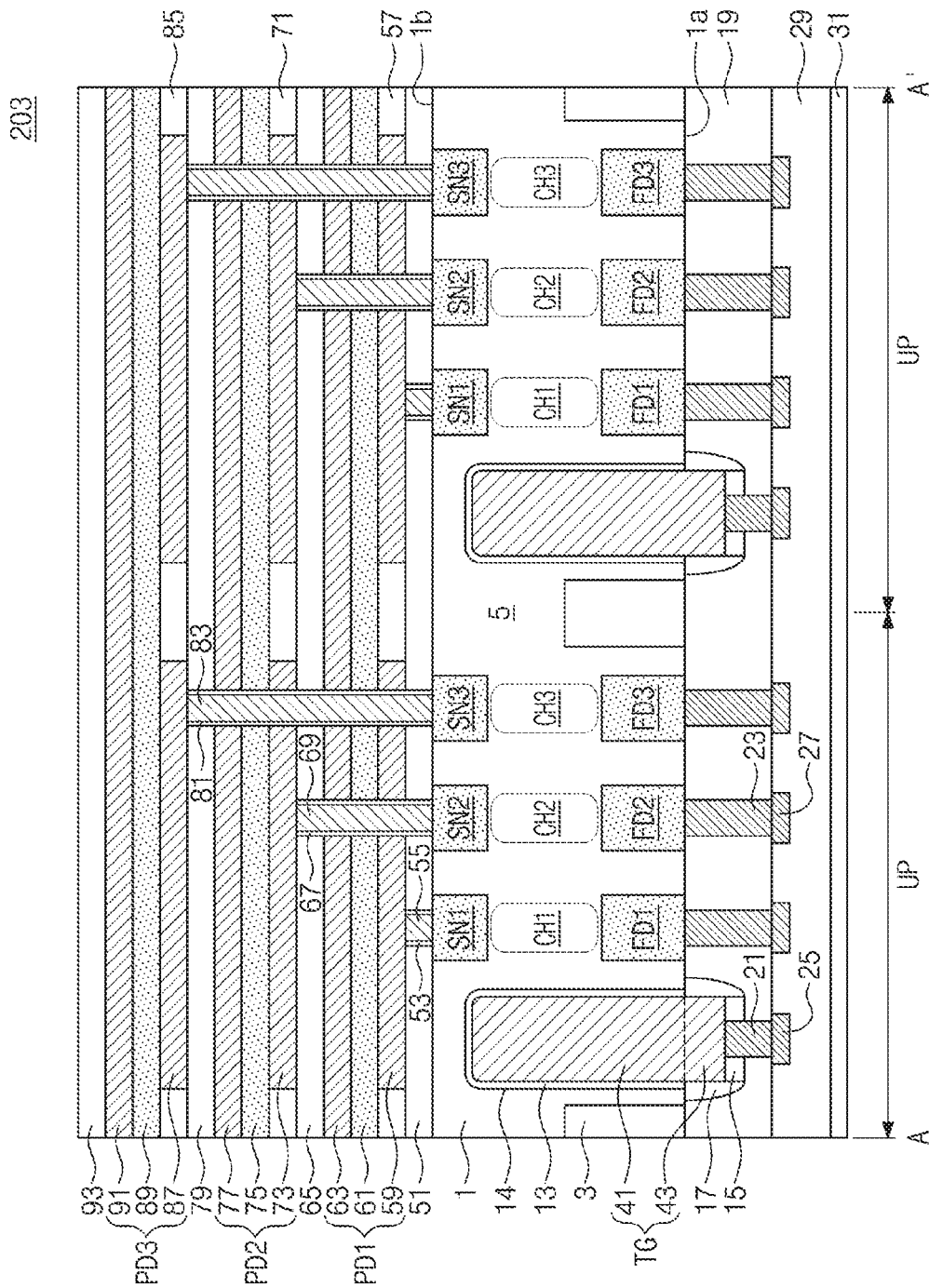
FIG. 18 is a sectional view taken along line A-A' of FIG. 17.

FIG. 17 is a plan view of an image sensor according to an exemplary embodiment of the inventive concept. FIG. 18 is a sectional view taken along line A-A' of FIG. 17.

In an image sensor 203 shown in FIGS. 17 and 18, floating diffusion parts FD1-FD3 and storage nodes SN1, SN2, and SN3 may not be impurity regions but may be semiconductor patterns that are doped to have a different conductivity type (e.g., the second conductivity type) from that of the well region 5. The semiconductor patterns may be formed of or include, for example, polysilicon or silicon germanium. The formation of the floating diffusion parts FD1, FD2, and FD3 may include etching a portion of the semiconductor substrate 1 adjacent to the first surface 1a to form a plurality of separated trenches, and then, depositing a semiconductor material to fill the trenches. In this case, the process for forming the floating diffusion parts FD1, FD2, and FD3 may be performed during the process described with reference to FIG. 6, and the semiconductor material for the floating diffusion parts FD1, FD2, and FD3 may be doped in an in-situ manner. The formation of the storage nodes SN1, SN2, and SN3 may include etching a portion of the semiconductor substrate 1 adjacent to the second surface 1b to form a plurality of separated trenches, and then, depositing a semiconductor material to fill the trenches. In this case, the process for forming the storage nodes SN1, SN2, and SN3 may be performed during the process described with reference to FIG. 8, and the semiconductor material for the storage nodes SN1, SN2, and SN3 may be doped in an in-situ manner. As described above, in the case where the semiconductor patterns are used as the floating diffusion parts FD1-FD3 and the storage nodes SN1, SN2, and SN3, it is possible to clearly separate these regions from each other. Except for the above differences, the image sensor 203 may be fabricated by a method that is substantially the same as or similar to that described with reference to FIGS. 1 to 4.

Figure 19:
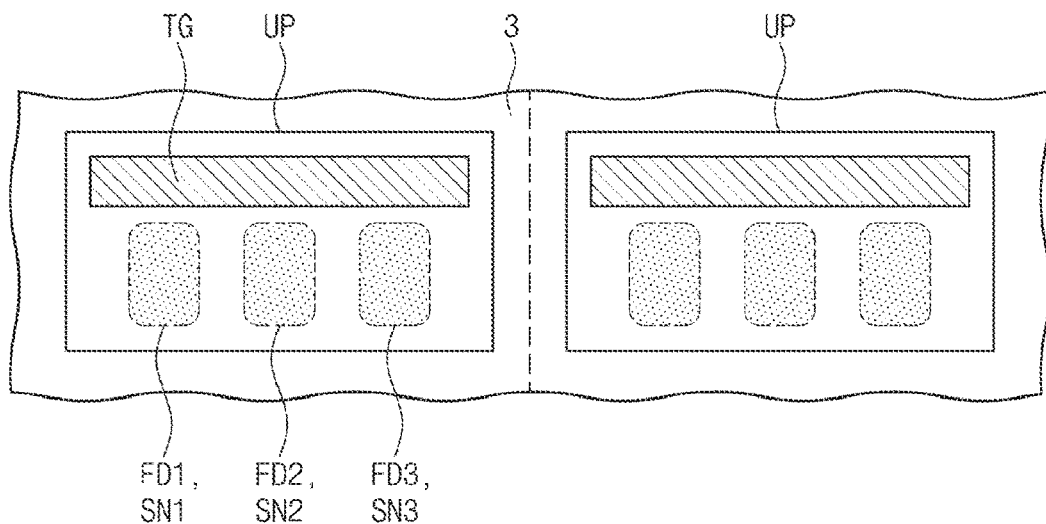
FIG. 19 is a plan view of an image sensor according to an exemplary embodiment of the inventive concept.
Figure 20:
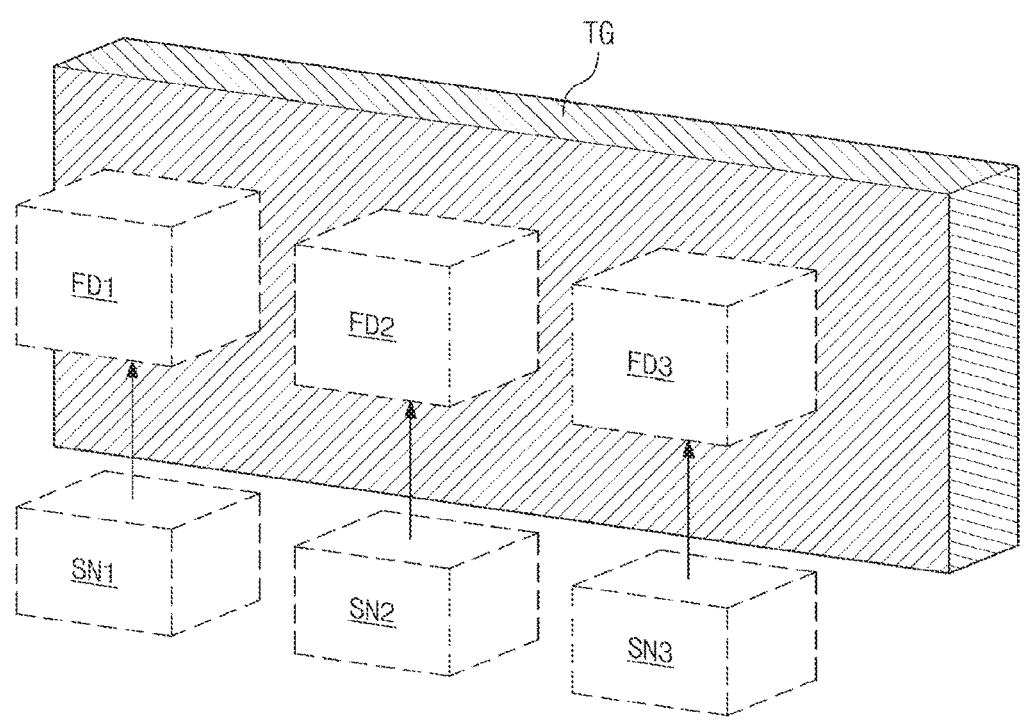
FIG. 20 is a perspective view illustrating a portion of the image sensor of FIG. 19.

FIG. 19 is a plan view of an image sensor according to an exemplary embodiment of the inventive concept. FIG. 20 is a perspective view illustrating a portion of the image sensor of FIG. 19.

In an image sensor 204 shown in FIGS. 19 and 20, a transfer gate TG may have a bar-shaped structure elongated in a specific direction. For example, the transfer gate TG may be extended along the direction in which the floating diffusion parts FD1, FD2 and FD3 are arranged. The transfer gate TG may be inserted into the semiconductor substrate 1 through the first surface 1a and may face side surfaces of the floating diffusion parts FD1, FD2, and FD3, If the transfer gate TG is applied with a voltage, channel regions may be formed near the transfer gate TG, thereby allowing electric charges to be moved from the storage nodes SN1, SN2 and SN3 to the floating diffusion parts FD1, FD2, and FD3 (e.g., in a direction depicted by the arrows in FIG. 20). Since this structure of the transfer gate TG is fairly simple, it is possible to increase an integration density of the image sensor 204 and simplify a process of fabricating the image sensor 204. Except for the above features, the image sensor 204 may be configured to have substantially the same features as those of the image sensor 200 described with reference to FIGS. 1 to 4.

Figure 21:
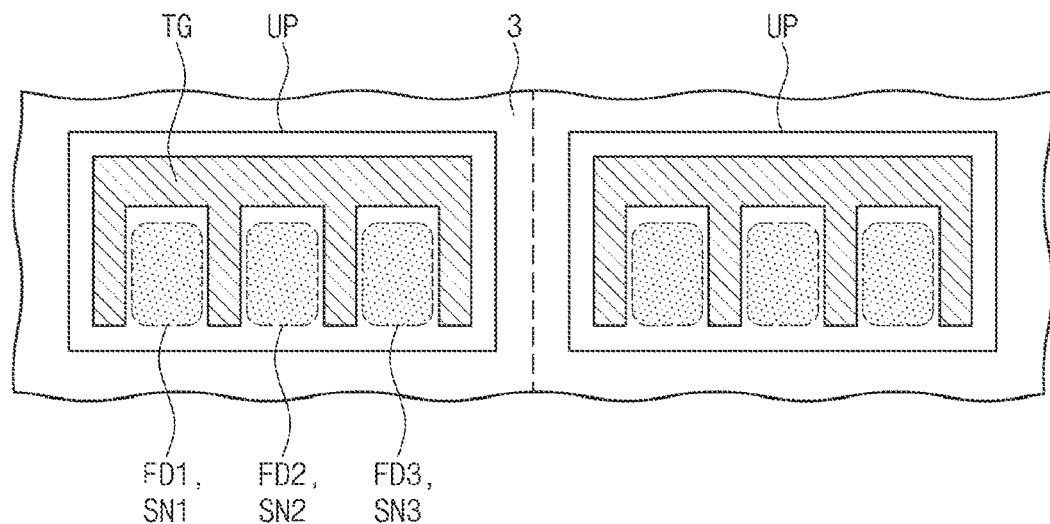
FIG. 21 is a plan view of an image sensor according to an exemplary embodiment of the inventive concept.
Figure 22:
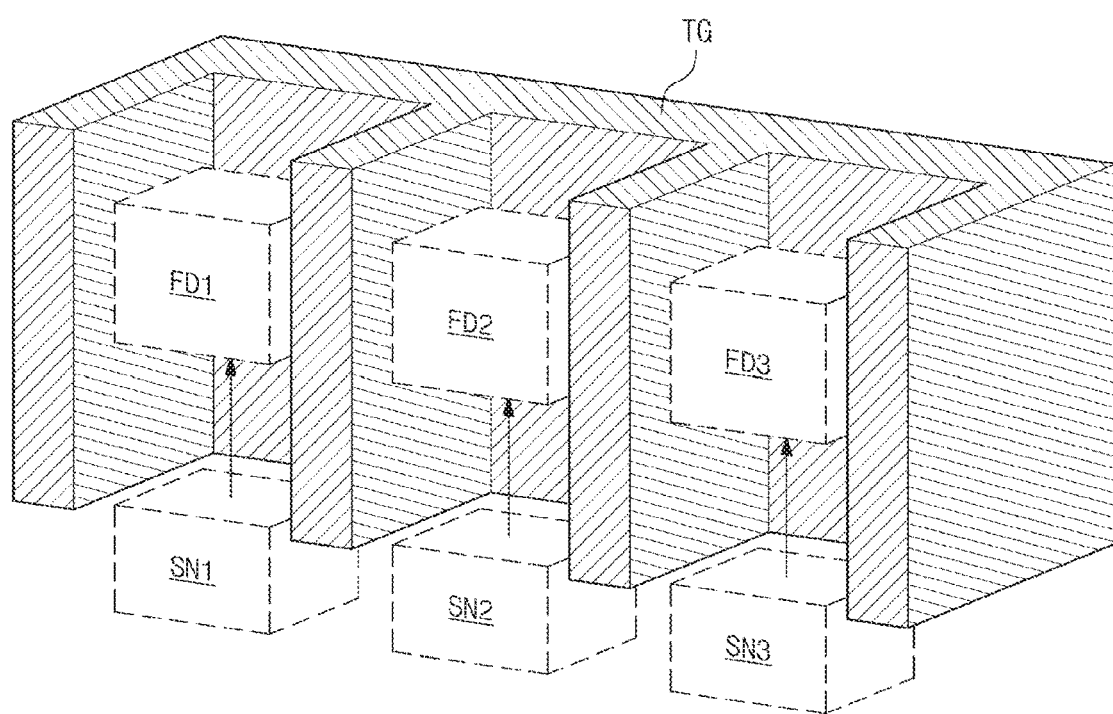
FIG. 22 is a perspective view illustrating a portion of the image sensor of FIG. 21.

FIG. 21 is a plan view of an image sensor according to an exemplary embodiment of the inventive concept. FIG. 22 is a perspective view illustrating a portion of the image sensor of FIG. 21.

In an image sensor 205 shown in FIGS. 21 and 22, a transfer gate TG may have a comb-shaped structure, when viewed in a plan view, and may be inserted into the semiconductor substrate 1 through the first surface 1a, when viewed in a sectional view. The transfer gate TG may face three side surfaces of each of the floating diffusion parts FD1, FD2, and FD3. For example, the transfer gate TG may include at least one portion interposed between adjacent ones of the floating diffusion parts FD1, FD2 and FD3. Due to this structure of the transfer gate TG, it is possible to more easily produce the channel regions CH1, CH2, and CH3 in the semiconductor substrate 1. Furthermore, the channel regions CH1, CH2, and CH3 may be separated from each other by the transfer gate TG, even when the separation region 95 of FIG. 14 or the separation part 96 of FIG. 16 is not provided. This is so, because the teeth of the comb-shaped transfer gate TG are disposed on opposite sides of each of the floating diffusion parts FD1, FD2, and FD3. Except for the above features, the image sensor 205 may be configured to have substantially the same features as those of the image sensor 200 described with reference to FIGS. 1 to 4.

Figure 23:
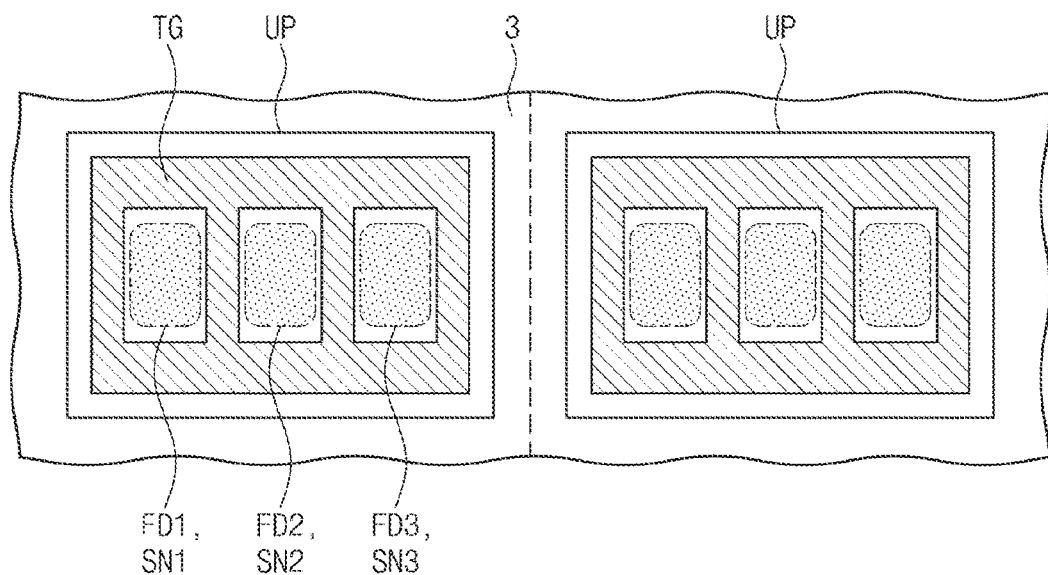
FIG. 23 is a plan view of an image sensor according to an exemplary embodiment of the inventive concept.
Figure 24:
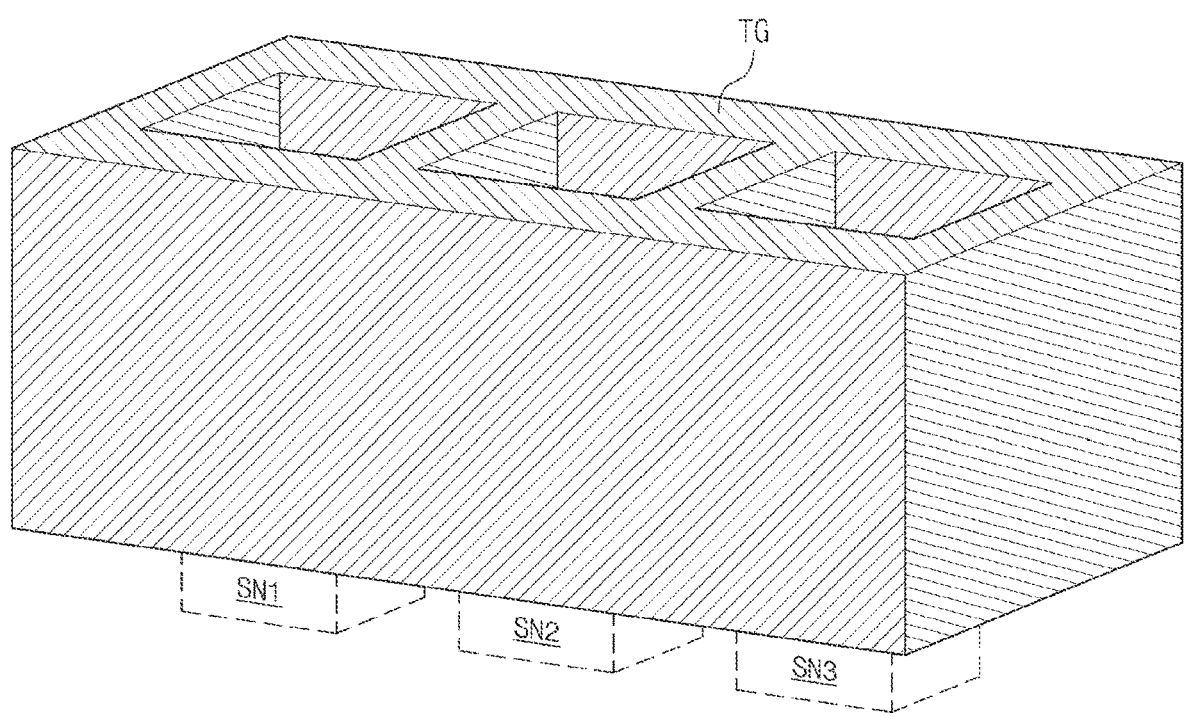
FIG. 24 is a perspective view illustrating a portion of the image sensor of FIG. 23.

FIG. 23 is a plan view of an image sensor according to an exemplary embodiment of the inventive concept. FIG. 24 is a perspective view illustrating a portion of the image sensor of FIG. 23.

In an image sensor 206 shown in FIGS. 23 and 24, a transfer gate TG may have a ladder-shaped or cinder-block shaped structure, when viewed in a plan view, and may be inserted into the semiconductor substrate 1 through the first surface 1a, when viewed in a sectional view. For example, the transfer gate TG may be provided to surround each of the floating diffusion parts FD1, FD2, and FD3. Due to this surround gate structure of the transfer gate TG, it is possible to more easily produce the channel regions CH1, CH2, and CH3 in the semiconductor substrate 1. Furthermore, the channel regions CH1, CH2, and CH3 may be separated from each other by the transfer gate TG, even when the separation region 95 of FIG. 14 or the separation part 96 of FIG. 16 is not provided. Except for the above features, the image sensor 206 may be configured to have substantially the same features as those of the image sensor 200 described with reference to FIGS. 1 to 4, FIG. 25 is a plan view of an image sensor according to an exemplary embodiment of the inventive concept. FIG. 26 is a sectional view taken along line A-A' of FIG. 25.

Figure 25:
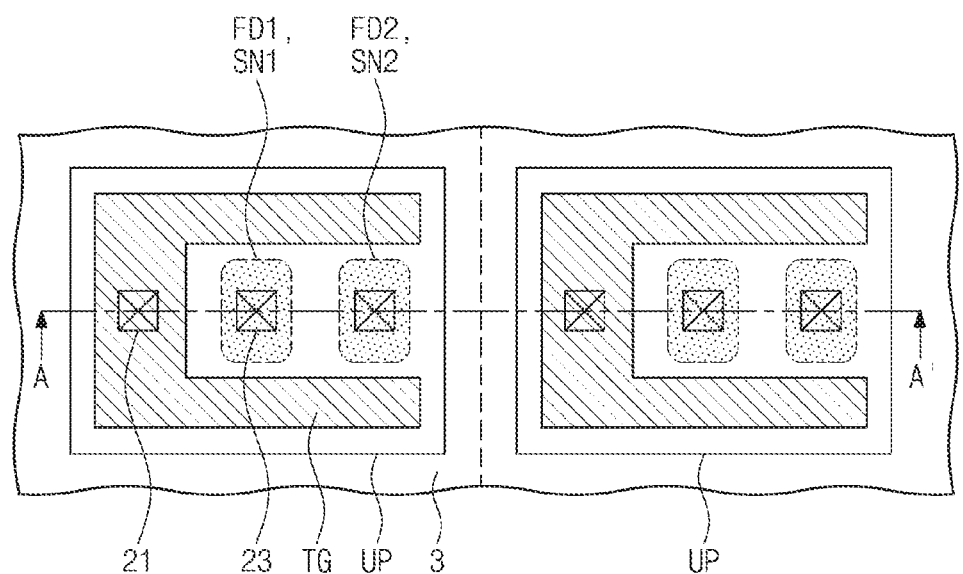
FIG. 25 is a plan view of an image sensor according to an exemplary embodiment of the inventive concept.
Figure 26:
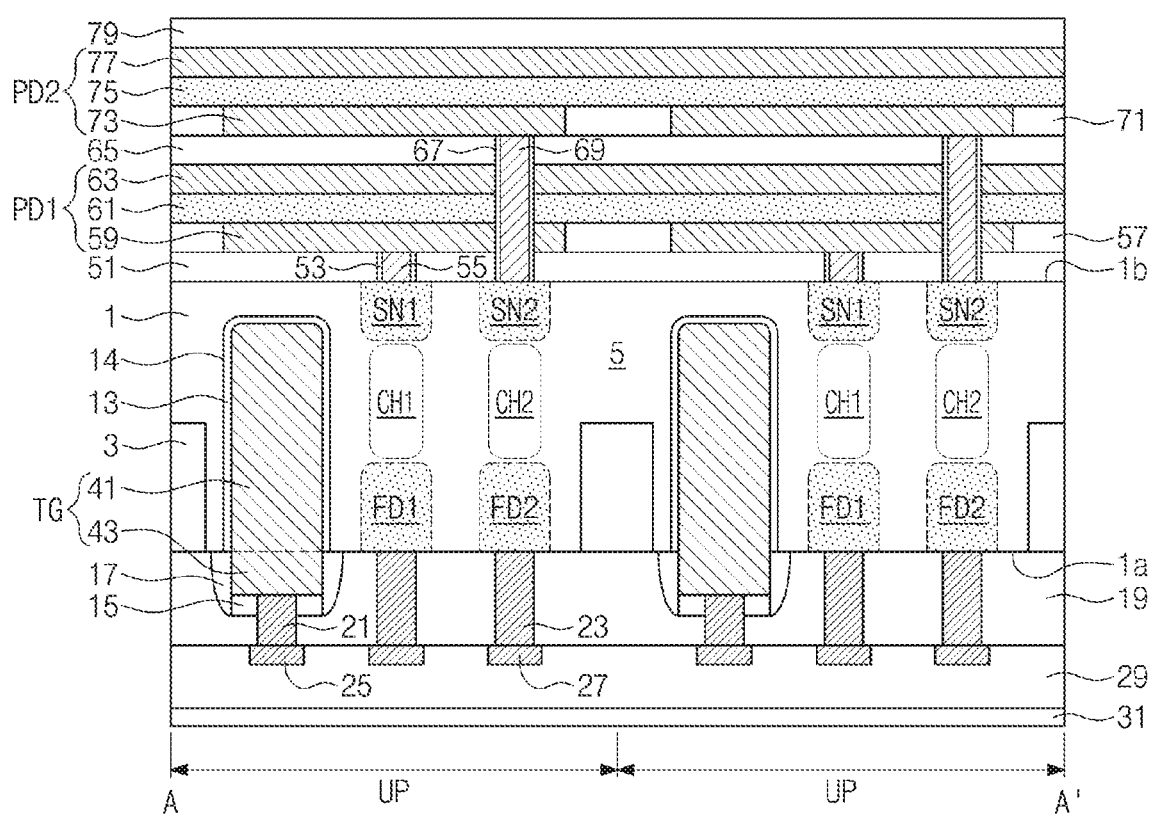
FIG. 26 is a sectional view taken along line A-A' of FIG. 25.

Referring to FIGS. 25 and 26, an image sensor 207 may have a double-layered structure of photoelectric conversion parts PD1 and PD2. For example, two photoelectric conversion parts PD1 and PD2 are included in the image sensor 207. In this case, each of the unit pixel regions UP of the image sensor 207 may include a pair of floating diffusion parts FD1 and FD2 and a pair of storage nodes SN1 and SN2. The photoelectric conversion parts PD1 and PD2 may be configured to detect lights having wavelengths corresponding to two different colors (e.g., selected from red, green, and blue). Except for the above feature the image sensor 207 may be configured to have substantially the same features as those of the image sensor 200 described with reference to FIGS. 1 to 4.

Figure 27:
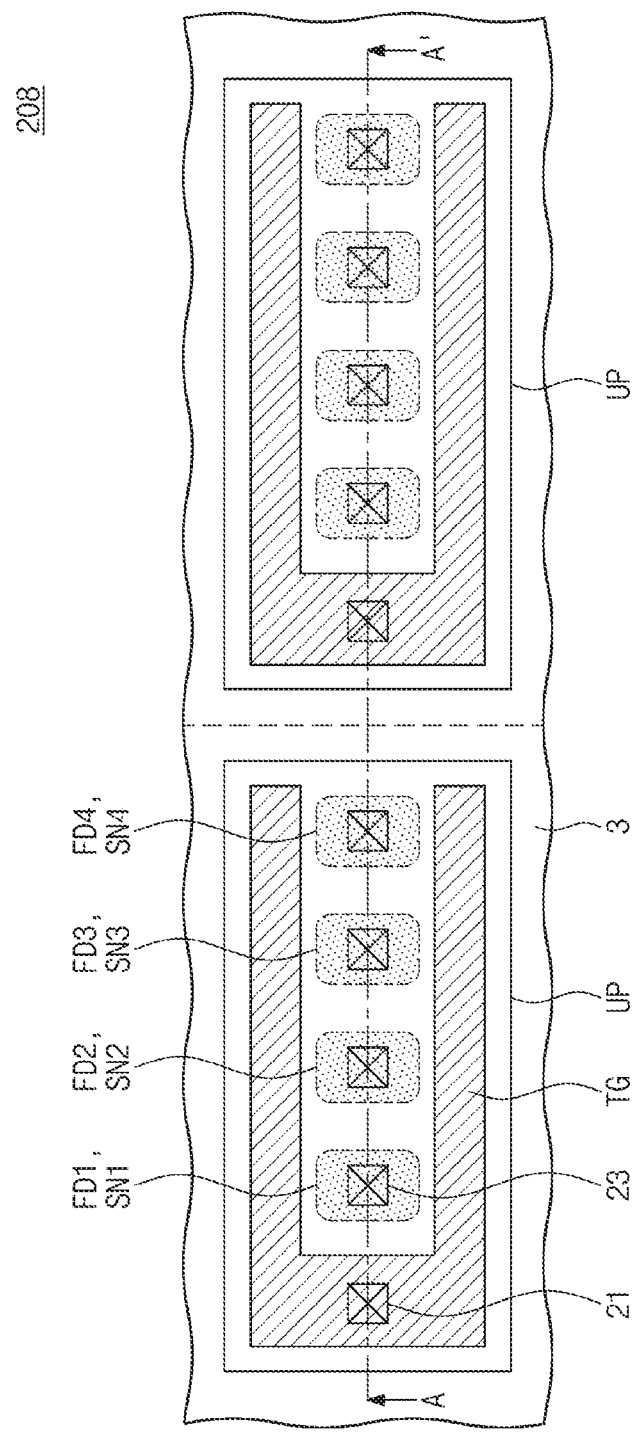
FIG. 27 is a plan view of an image sensor according to an exemplary embodiment of the inventive concept.
Figure 28:
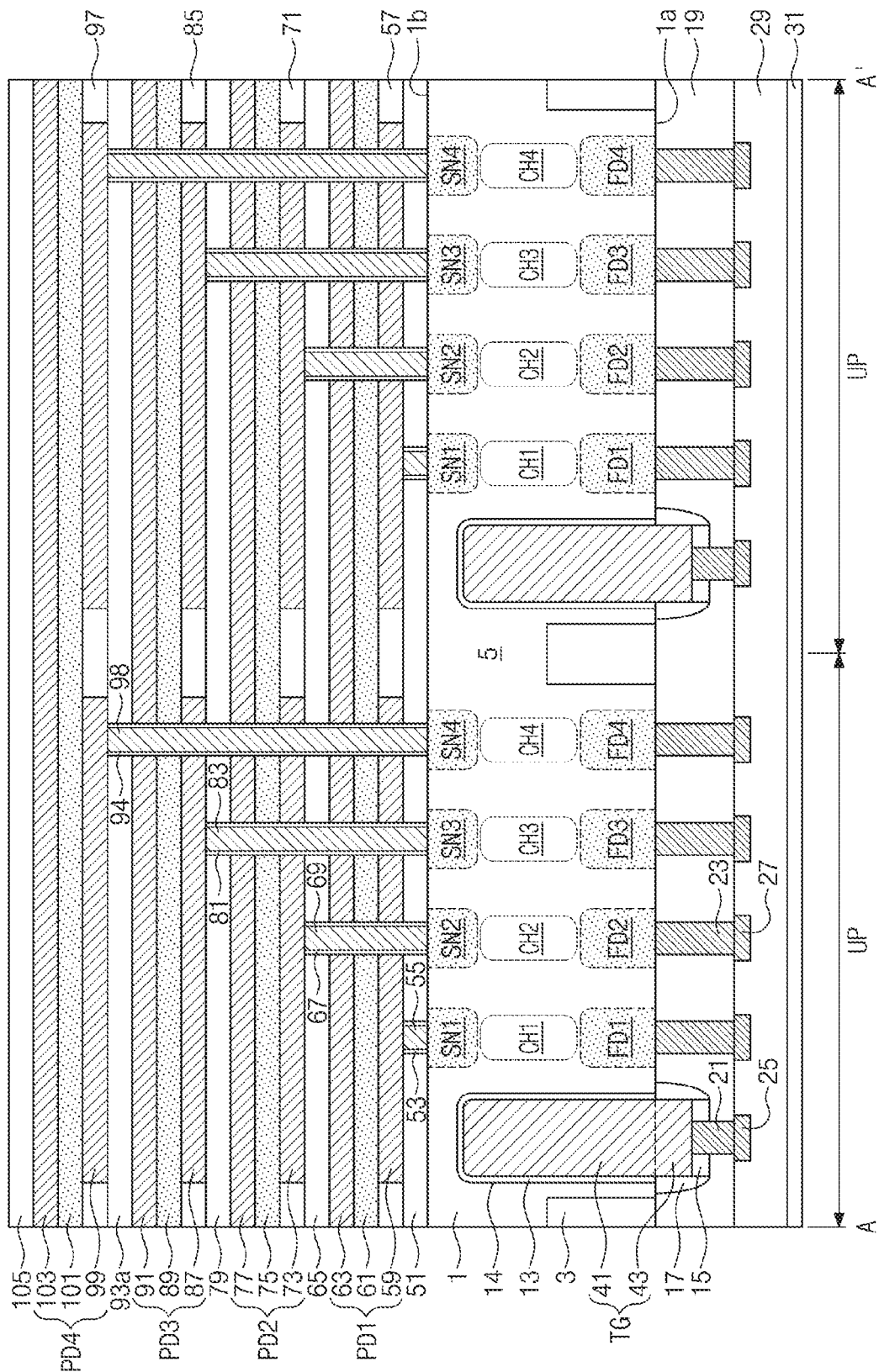
FIG. 28 is a sectional view taken along line A-A' of FIG. 27.

FIG. 27 is a plan view of an image sensor according to an exemplary embodiment of the inventive concept. FIG. 28 is a sectional view taken along line A-A' of FIG. 27.

Referring to FIGS. 27 and 28, an image sensor 208 may have a quadruple-layered structure of photoelectric conversion parts PD1, PD2, PD3, and PD4. For example, four photoelectric conversion parts PD1-PD4 are included in the image sensor 208. In this case, each of the unit pixel regions UP of the image sensor 208 may include four floating diffusion parts FD1, FD2, FD3, and FD4 and four storage nodes SN1, SN2, SN3, and SN4 corresponding thereto. A sixth interlayered insulating layer 93a may be interposed between the third photoelectric conversion part PD3 and the fourth photoelectric conversion part PD4. The fourth photoelectric conversion part PD4 may include a fourth pixel electrode 99, a fourth photoelectric conversion layer 101, and a fourth common electrode 103. The fourth pixel electrode 99 may be divided into a plurality of patterns, which are respectively provided on the unit pixel regions UP, by a fourth insulating pattern 97. The fourth insulating pattern 97 and the sixth interlayered insulating layer 93a may be formed of an insulating material (e.g., silicon oxide). The fourth photoelectric conversion part PD4 may be covered with a protection layer 105. The fourth pixel electrode 99 may be electrically connected to the fourth storage node SN4 through a fourth SN contact plug 98. A fourth insulating layer 94 may be provided to surround a side surface of the fourth SN contact plug 98, and thus, the fourth SN contact plug 98 may be electrically separated from the first to third photo electric conversion parts PD1, PD2, and PD3. Except for the above features, the image sensor 208 may be configured to have substantially the same features as those of the image sensor 200 described with reference to FIGS. 1 to 4.

Figure 29:
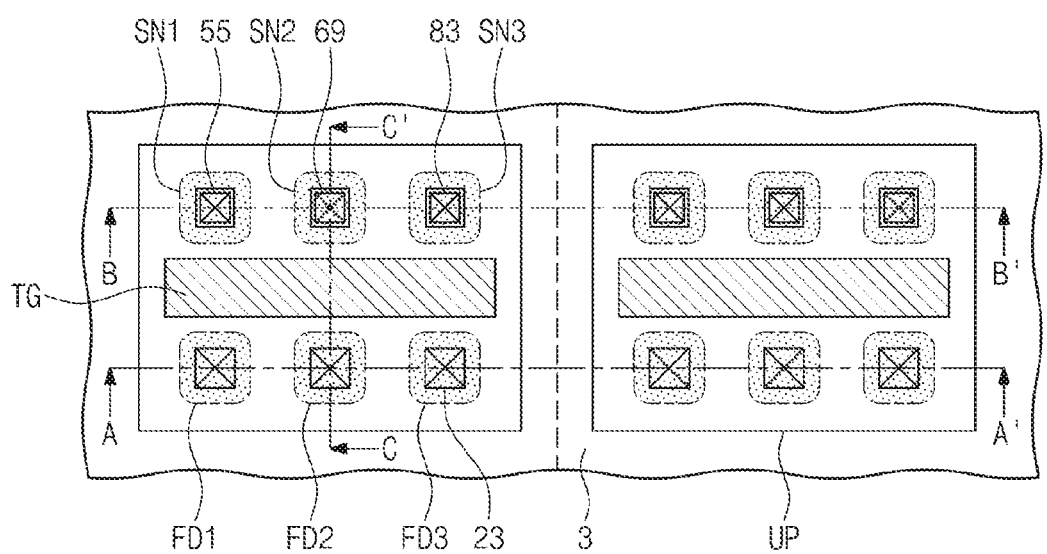
FIG. 29 is a plan view of an image sensor according to an exemplary embodiment of the inventive concept.
Figure 30:
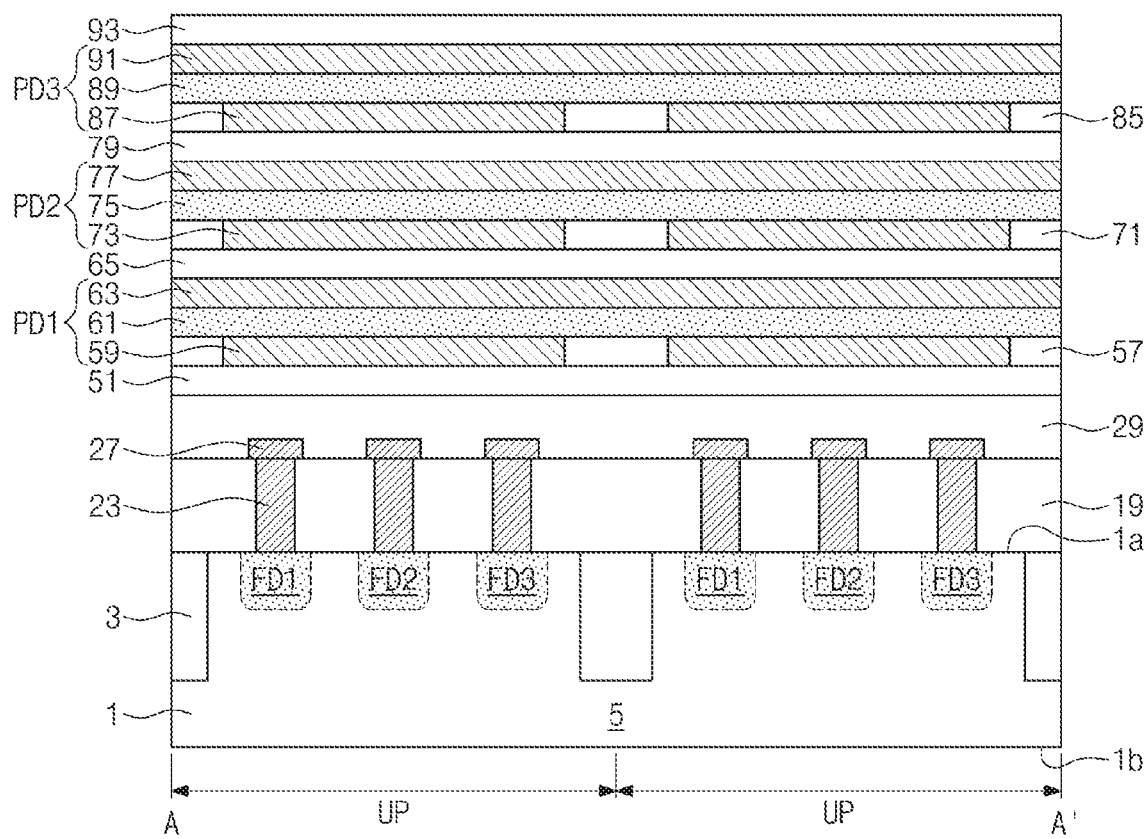
FIG. 30 is a sectional view taken along line A-A' of FIG. 29.
Figure 31:
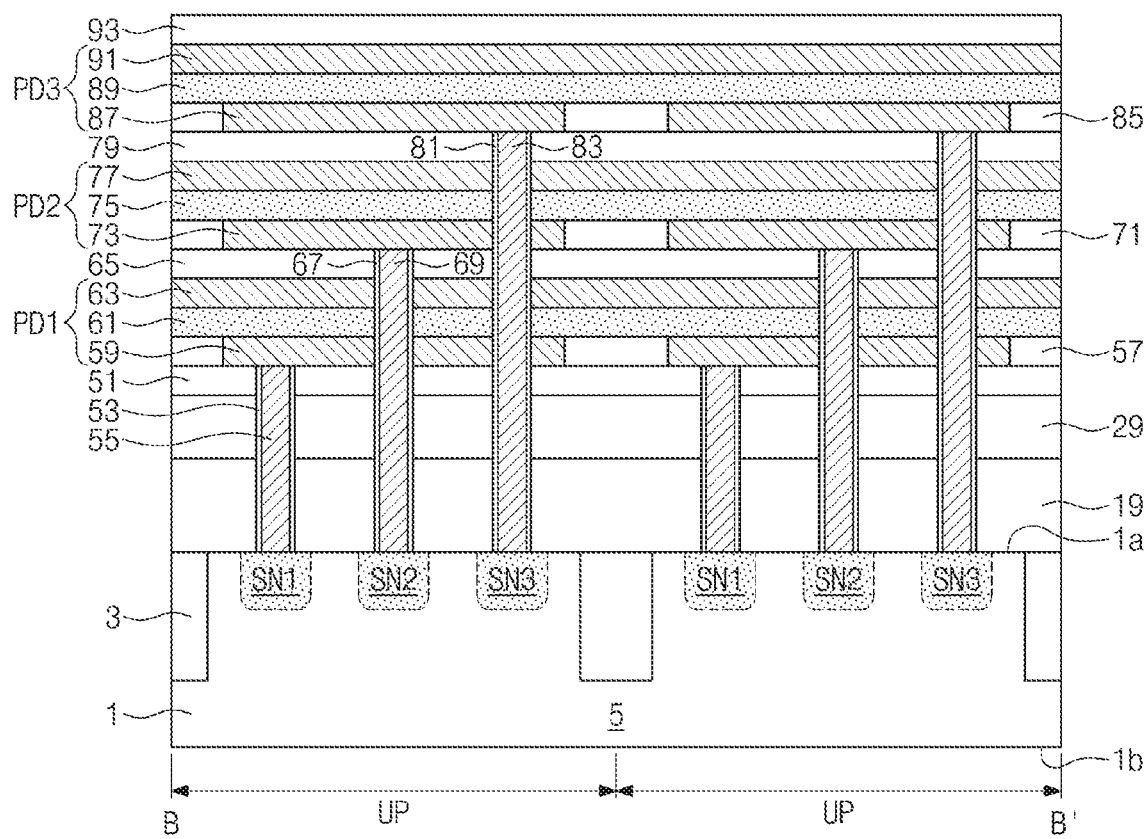
FIG. 31 is a sectional view taken along line B-B' of FIG. 29.
Figure 32:
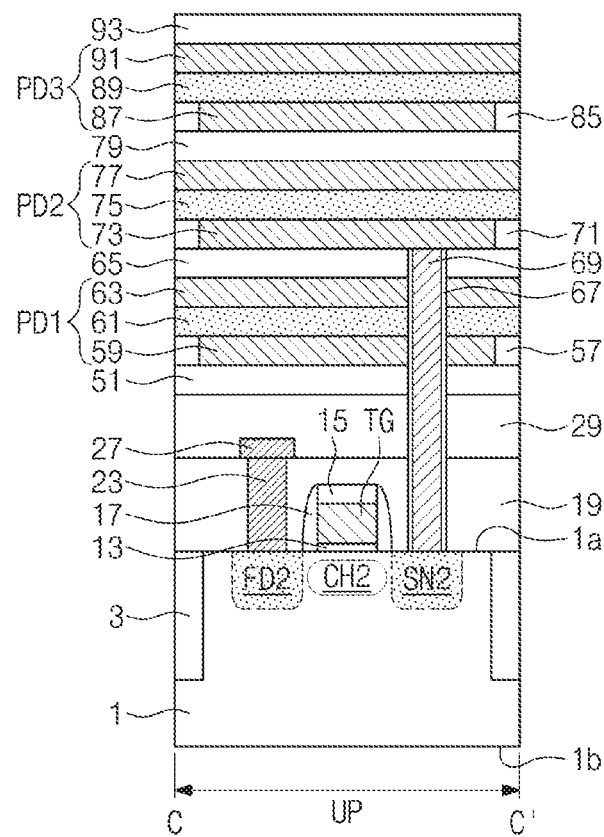
FIG. 32 is a sectional view taken along line C-C' of FIG. 29.

FIG. 29 is a plan view of an image sensor according to an exemplary embodiment of the inventive concept FIG. 30 is a sectional view taken along line A-A' of FIG. 29. FIG. 31 is a sectional view taken along line B-B' of FIG. 29. FIG. 32 is a sectional view taken along line C-C' of FIG. 29.

In an image sensor 209 shown in FIGS. 29 to 32, a transfer gate TG may be provided on the first surface 1a of the semiconductor substrate 1 and may have a bar-shaped structure elongated in a specific direction. A plurality of floating diffusion parts FD1, FD2, and FD3 may be provided in the semiconductor substrate 1 adjacent to the first surface 1a to face a side surface of the transfer gate TG. The transfer gate TG may be extended along an arrangement direction of the floating diffusion parts FD1-FD3. The floating diffusion parts FD1, FD2, and FD3 may be spaced apart from each other and may be arranged along the side surface of the transfer gate TG. A plurality of storage nodes SN1, SN2, and SN3 may be provided in the semiconductor substrate 1 adjacent to the first surface 1a to face an opposite side surface of the transfer gate TG. The storage nodes SN1, SN2, and SN3 may be spaced apart from each other and may be arranged, along the opposite side surface of the transfer gate TG. Each of the storage nodes SN1, SN2, and SN3 may face a corresponding one of the floating diffusion parts FD1, FD2, and FD3 with the transfer gate TG interposed therebetween. A gate insulating layer 13 may be interposed between the transfer gate TG and the semiconductor substrate 1. If a voltage is applied to the transfer gate TG, channel regions may be formed in the semiconductor substrate 1 below the transfer gate TG and spaced apart from each other, and thus, electric charges may be transferred from the storage nodes SN1, SN2, and SN3 to the floating diffusion parts FD1, FD2, and FD3 in a horizontal direction.

Next, the first surface 1a may be covered with a first interlayered insulating layer 19. FD contact plugs 23 may penetrate the first interlayered insulating layer 19 and may be in contact with the floating diffusion parts FD1, FD2, and FD3 respectively. FD lines 27 may be provided on the first interlayered insulating layer 19 and may be in contact with the FD contact plugs 23, respectively. The first interlayered insulating layer 19 may be covered with a second interlayered insulating layer 29. A third interlayered insulating layer 51 may be provided on the second interlayered insulating layer 29. The third interlayered insulating layer 51 may be omitted from the image sensor 209. A triple-layered structure, in which photoelectric conversion parts PD1, PD2, and PD3 are sequentially stacked, may be provided on the third interlayered in insulating layer 51. To connect the first, second and third pixel electrodes 59, 73, 87 to the storage nodes SN1, SN2, and SN3, respectively, first, second and third SN contact plugs 55, 69, and 83 may penetrate the second interlayered insulating layer 29 and the first interlayered insulating layer 19.

Thereafter, on each of the unit pixel regions UP of the image sensor 209, the FD contact plugs 23 may be provided at a side of the transfer gate TG, and the first, second and third SN contact plugs 55, 69, and 83 may be provided at opposite sides of the transfer gate TG. As described above, the ED contact plugs 23 may have an optical transmittance different from that of the first, second and third SN contact plugs 55, 69, and 83. Top surfaces of the FD contact plugs 23 may be lower than top surfaces of the first, second and third SN contact plugs 55, 69, and 83. Except for the above features, the image sensor 209 may be configured to have substantially the same features as those of the image sensor 200 described with reference to FIGS. 1 to 4.

Figure 33:
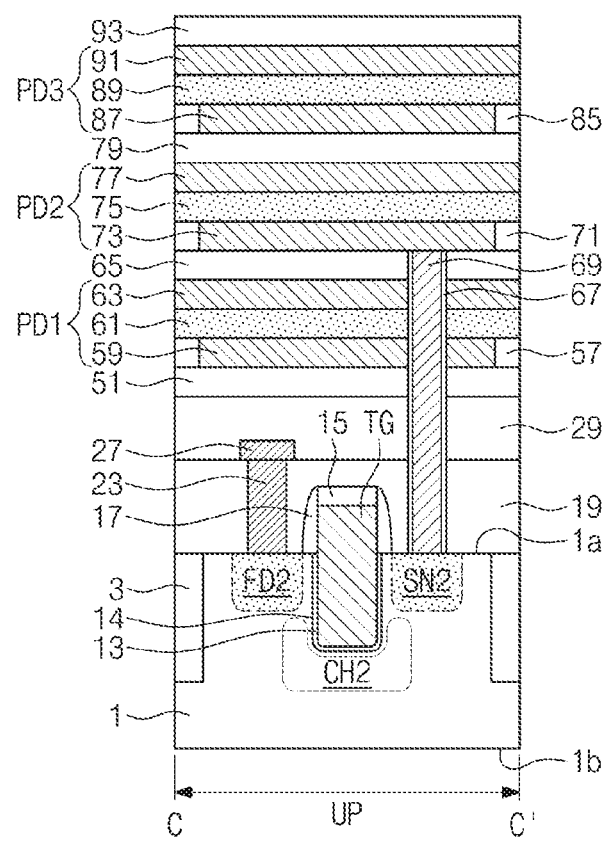
FIG. 33 is a sectional view taken along line C-C' of FIG. 29 to illustrate an image sensor according to an exemplary embodiment of the inventive concept.

FIG. 33 is a sectional view taken along line C-C' of FIG. 29 to illustrate an image sensor according to an exemplary embodiment of the inventive concept.

In an image sensor 209a shown in FIG. 33, a portion of a transfer gate TG may be inserted into the substrate 1. This may lead to an increase in the length of channel region CH2, and thus, it is possible to prevent a short channel effect. Except for the above features, the image sensor 209a may be configured to have substantially the same features as those of the image sensor 209 described with reference to FIGS. 29 to 32.

Figure 34:
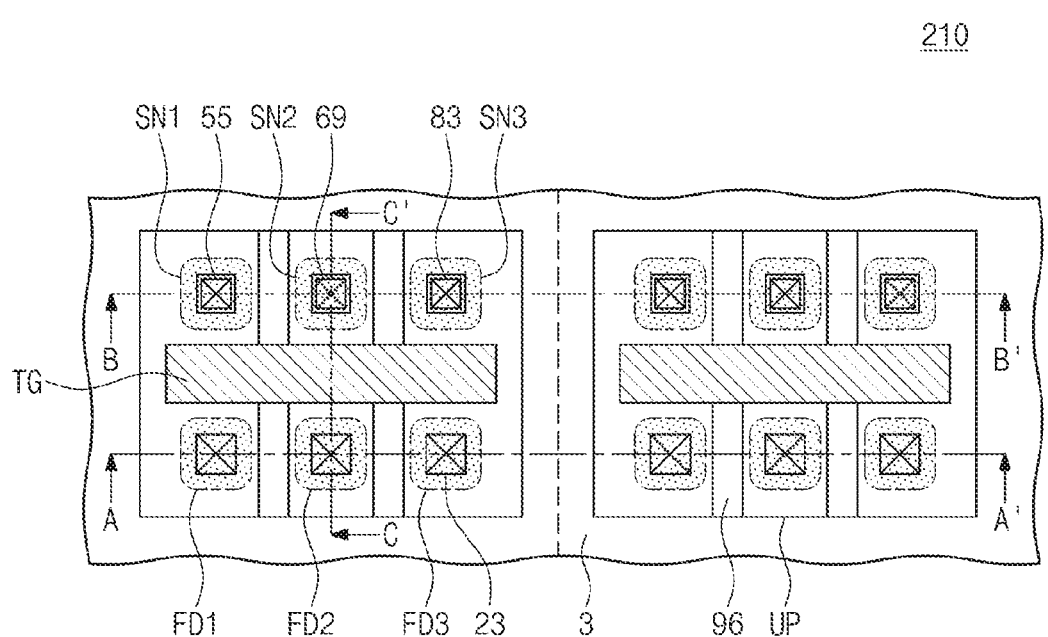
FIG. 34 is a plan view of an image sensor according to an exemplary embodiment of the inventive concept.
Figure 35:
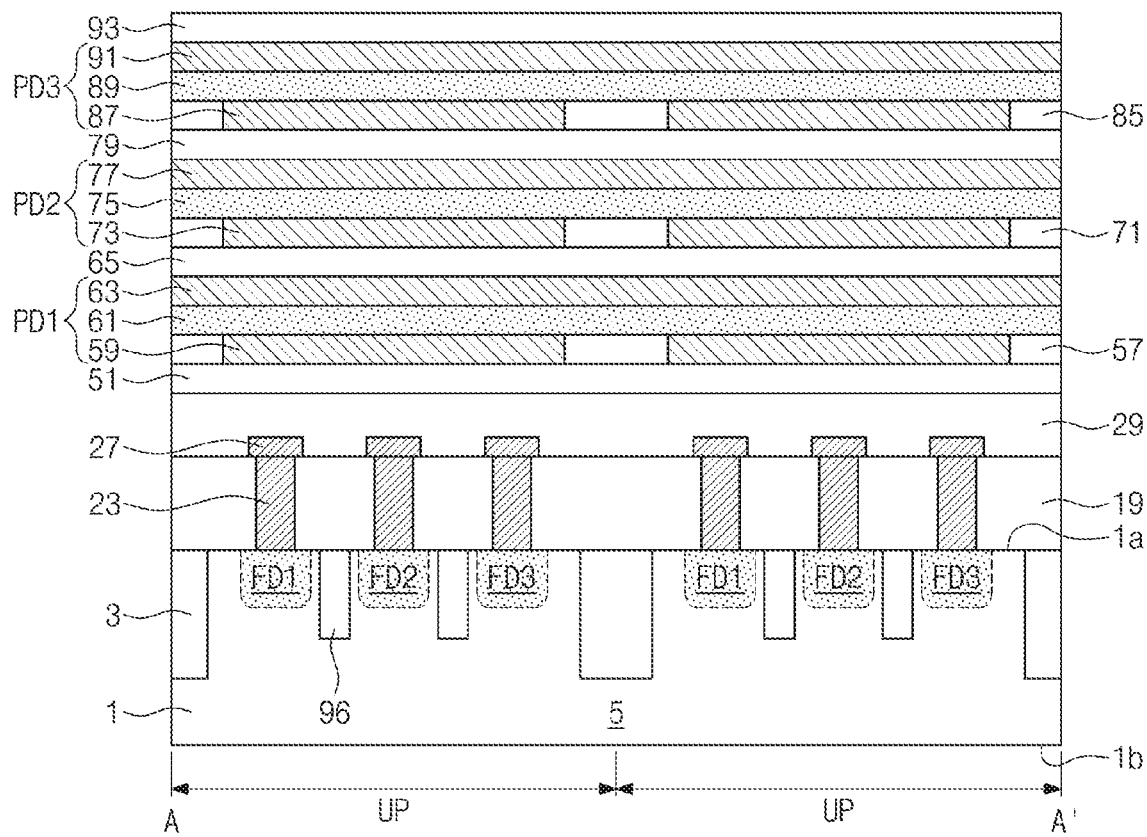
FIG. 35 is a sectional view taken along line A-A' of FIG. 34.
Figure 36:
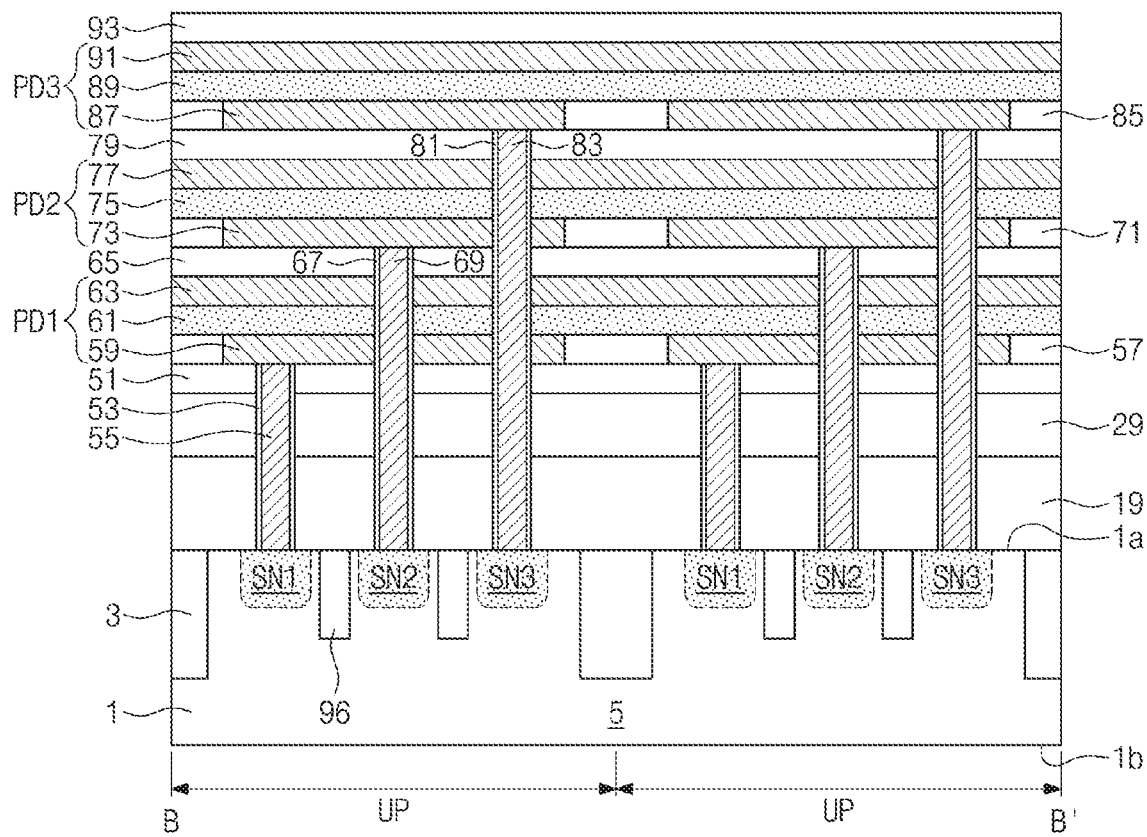
FIG. 36 is a sectional view taken along line B-B' of FIG. 34.
Figure 37:
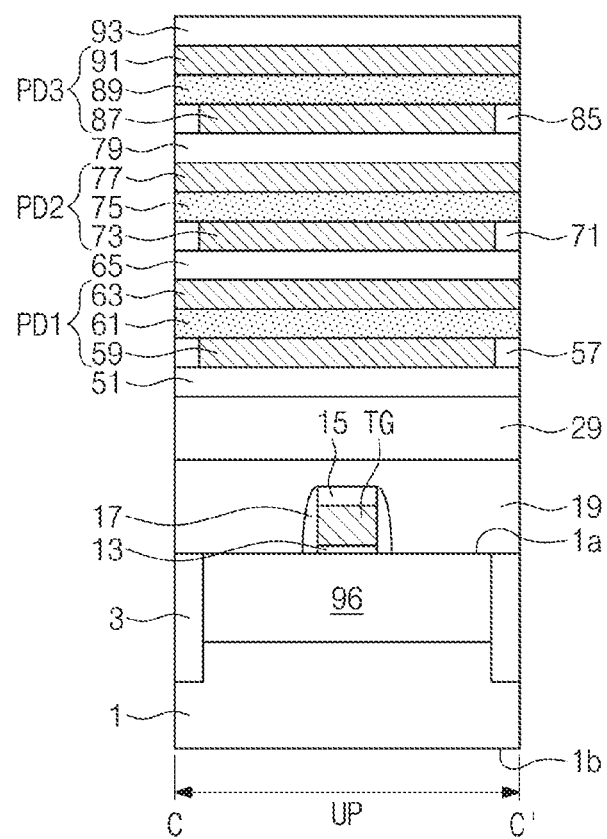
FIG. 37 is a sectional view taken along line D-D' of FIG. 34.

FIG. 34 is a plan view of an image sensor according to an exemplary embodiment of the inventive, concept. FIG. 35 is a sectional view taken along line A-A' of FIG. 34. FIG. 36 is a sectional view taken along line B-B' of FIG. 34. FIG. 37 is a sectional view taken along line D-D' of FIG. 34.

In an image sensor 210 shown in FIGS. 34 to 37, separation parts 96 may be inserted into the substrate 1 through the first surface 1a. For example, the separation parts 96 may be in direct contact with the first surface 1a. The separation parts 96 may be provided to cross the transfer gate TG, when viewed in a plan view. The separation parts 96 may be formed of an insulating material or may be semiconductor patterns. When the separation parts 96 are formed of an insulating material, the separation parts 96 may be formed at the same time as when the device isolation layer 3 is formed. When the separation parts 96 are semiconductor patterns, the separation parts 96 may be doped to have the same conductivity type (e.g., the first conductivity type) as that of the well region 5 or to have a doping concentration higher than that of the well region 5. Except for the above features, the image sensor 210 may be configured to have substantially the same features as those of the image sensor 209 described with reference to FIGS. 29 to 32.

According to an exemplary embodiment of the inventive concept, an image sensor may include a plurality of unit pixel regions, each of which is configured to detect lights with different wavelengths. A single transfer gate can be used to transfer signals, which are generated from lights with different wavelengths, and thus, it is possible to increase an operation speed and an integration density of an image sensor. In addition, photoelectric conversion parts may be placed outside a substrate and electrically disconnected (or separated) from each other, and thus, it is possible to prevent a cross-talk phenomenon from occurring between adjacent pixels. Furthermore, according to exemplary embodiment of the inventive concept, an image sensor may not require a color filter or a micro lens, and thus, it is possible to reduce complexity and cost in a fabrication process.

While the inventive concept has been particularly shown and described with reference to exemplary embodiments thereof, it will be understood by one of ordinary skill in the art that variations in form and detail may be made therein without departing from the spirit and scope of the attached claims.

What is claimed is:

1. An image sensor, comprising:
    a substrate including a plurality of unit pixel regions, the substrate having first and second surfaces facing each other,
    wherein each of the unit pixel regions comprises:
        a plurality of floating diffusion parts, which are arranged in a line and spaced apart from each other in the substrate;
        a plurality of storage nodes provided in the substrate and spaced apart from the floating diffusion parts, wherein the storage nodes face the floating diffusion parts respectively;
        a transfer gate adjacent to a region between the floating diffusion parts and the storage nodes;
        a plurality of photoelectric conversion parts sequentially stacked on the first surface or the second surface of the substrate,
    wherein the photoelectric conversion parts absorb lights with different wavelengths and generate electric charges from the absorbed lights, and the electric charges are transferred from the photoelectric conversion parts to their corresponding storage nodes, and
    wherein a signal from a first one of the storage nodes to a corresponding first one of the floating diffusion parts is simultaneously transferred with a signal from a second one of the storage nodes to a corresponding second one of the floating diffusion parts by the transfer gate in one of the unit pixel regions.

2. The image sensor of claim 1, wherein each of the unit pixel regions further comprise:
    a plurality of channel regions which are provided between the floating diffusion parts and the storage nodes, respectively; and
    at least one separation part interposed between the channel regions.

3. The image sensor of claim 2, wherein the at least one separation part is an insulating layer, an impurity region or a semiconductor pattern that is doped to have a conductivity type different from that of the floating diffusion parts.

4. The image sensor of claim 2, wherein the at least one separation part is extended into at least one of a gap between adjacent floating diffusion parts and a gap between adjacent storage nodes.

5. The image sensor of claim 1, wherein the floating diffusion parts are adjacent to the first surface, the storage nodes are adjacent to the second surface, and the photoelectric conversion parts are stacked on the second surface.

6. The image sensor of claim 5, wherein the transfer gate has a 'C'-shaped structure facing opposite sides of each of the floating diffusion parts.

7. The image sensor of claim 5, wherein the transfer gate has a comb-shaped structure facing three side surfaces of each of the floating diffusion parts.

8. The image sensor of claim 5, wherein the transfer gate has a ladder-shaped structure surrounding four sides of each of the floating diffusion parts.

9. The image sensor of claim 1, wherein the floating diffusion parts and the storage nodes in a first unit pixel region of the unit pixel regions are adjacent to the first surface, the transfer gate in the first unit pixel region is disposed on the first surface, and the photoelectric conversion parts in the first unit pixel region are sequentially stacked on the first surface.

10. The image sensor of claim 9, wherein the transfer gate is partially disposed in the substrate.

11. An image sensor, comprising:
    first, second and third layers disposed at a first side of a substrate, the first layer configured to detect a light having a wavelength corresponding to a first color, the second layer configured to detect a light having a wavelength corresponding to a second color, and the third layer configured to detect a light having a wavelength corresponding to a third color;
a first storage node connected to the first layer;
a second storage node connected to the second layer;
a third storage node connected to the third layer;
first, second and third floating diffusion parts disposed at a second side of the substrate, the first floating diffusion part facing the first storage node, the second floating diffusion part facing the second storage node, and the third floating diffusion part facing the third storage node; and
a transfer gate disposed adjacent to the first floating diffusion part,
wherein a signal from the first storage node to the first floating diffusion part is simultaneously transferred with a signal from the second storage node to the second floating diffusion part by the transfer gate in one, of the unit pixel regions.

12. The image sensor of claim 11, wherein the first, second and third layers are quantum dot layers or photoelectric conversion part layers.

13. The image sensor of claim 11, wherein the transfer gate includes a protruded gate portion on the second side and a buried gate portion extended from the protruded gate portion towards the first side.

14. The image sensor of claim 11, wherein the transfer gate is configured to simultaneously transfer signals associated with the first, second and third colors.

15. The image sensor of claim 11, wherein a signal from the third storage node to the third floating diffusion part is simultaneously transferred with a signal from the second storage node to the second floating diffusion part by the transfer gate in one of the unit pixel regions.

16. An image sensor, comprising:
first, second and third layers disposed at a first side of a substrate, the first layer configured to detect a light having a wavelength corresponding to a first color, the second layer configured to detect a light having a wavelength corresponding to a second color, and the third layer configured to detect a light having a wavelength corresponding to a third color;
first, second and third storage nodes sequentially arranged in a first direction in the substrate adjacent to the first side, the first storage node connected to the first layer, the second storage node connected to the second layer, and the third storage node connected to the third layer;
first, second and third floating diffusion parts sequentially arranged in the first direction in the substrate adjacent to the first side, the first, second and third floating diffusion parts spaced apart from the first, second and third storage nodes in a second direction perpendicular to the first direction; and
a single transfer gate on the first side of the substrate, the single transfer gate extending between the first storage node and the first floating diffusion part, between the second storage node and the second floating diffusion part, and between the third storage node and the third floating diffusion part.

17. The image sensor of claim 16, wherein a signal from the first storage node to the first floating diffusion part, a signal from the second storage node to the second floating diffusion part, and a signal from the third storage node to the third floating diffusion part are simultaneously transferred by the single transfer gate.

18. The image sensor of claim 16, wherein the transfer gate is partially disposed in the substrate.

19. The image sensor of claim 16, further comprising at least one separation part interposed among the first, second and third storage nodes and among first, second and third floating diffusion parts.

20. The image sensor of claim 19, wherein the at least one separation part is an insulating layer, an impurity region or a semiconductor pattern that is doped to have a conductivity type different from that of the first, second and third floating diffusion parts.

* * * * *